(12) United States Patent
Chong et al.

(10) Patent No.: US 10,855,986 B2
(45) Date of Patent: Dec. 1, 2020

(54) BANDWIDTH COMPRESSION FOR NEURAL NETWORK SYSTEMS

(71) Applicant: QUALCOMM Incorporated, San Diego, CA (US)

(72) Inventors: In Suk Chong, San Diego, CA (US); Xianglin Wang, San Diego, CA (US); Cheng-Teh Hsieh, Del Mar, CA (US)

(73) Assignee: Qualcomm Incorporated, San Diego, CA (US)

( * ) Notice: Subject to any disclaimer, the term of this patent is extended or adjusted under 35 U.S.C. 154(b) by 42 days.

(21) Appl. No.: 15/991,685

(22) Filed: May 29, 2018

(65) Prior Publication Data

US 2019/0373264 A1 Dec. 5, 2019

(51) Int. Cl.
*H04N 19/13* (2014.01)
*H03M 7/30* (2006.01)
(Continued)

(52) U.S. Cl.
CPC .............. *H04N 19/13* (2014.11); *G06N 3/02* (2013.01); *H03M 7/3066* (2013.01); *H04L 69/04* (2013.01); *H04N 19/176* (2014.11)

(58) Field of Classification Search
CPC ...... H04N 19/176; H04N 19/61; H04N 19/11; H04N 19/12; H04N 19/122; H04N 19/124; H04N 19/136; H04N 19/159; H04N 19/172; H04N 19/46; H04N 19/593; H04N 19/103; H04N 19/105; H04N 19/115; H04N 19/129; H04N 19/13; H04N 19/147; H04N 19/149; H04N 19/152; H04N 19/154; H04N 19/157; H04N 19/164; H04N 19/167; H04N 19/177; H04N 19/18; H04N 19/184; H04N 19/19; H04N 19/192; H04N 19/196; H04N 19/197; H04N 19/42; H04N 19/423; H04N 19/44; H04N 19/463; H04N 19/48;
(Continued)

(56) References Cited

U.S. PATENT DOCUMENTS 5,845,243 A 12/1998 Smart et al.
8,675,733 B2 3/2014 Mabey et al.
(Continued)

FOREIGN PATENT DOCUMENTS

WO 2017036370 A1 3/2017

OTHER PUBLICATIONS

Jiang W., et al., "A Video Coding Scheme Based on Joint Spatiotemporal and Adaptive Prediction", IEEE Transactions on Image Processing, May 2009, vol. 18, No. 5, pp. 1-10.
(Continued)

*Primary Examiner* — Joon Kwon
(74) *Attorney, Agent, or Firm* — Polsinelli LLP

(57) ABSTRACT

Techniques and systems are provided for compressing data in a neural network. For example, output data can be obtained from a node of the neural network. Re-arranged output data having a re-arranged scanning pattern can be generated. The re-arranged output data can be generated by re-arranging the output data into the re-arranged scanning pattern. One or more residual values can be determined for the re-arranged output data by applying a prediction mode to the re-arranged output data. The one or more residual values can then be compressed using a coding mode.

29 Claims, 16 Drawing Sheets

Tile is arranged in 256B of memory:
- bytes 0:63 → tile(0,0,0:63)
- bytes 64:127 → tile(1,0,0:63)
- bytes 128:191→ tile(2,0,0:63)
- bytes 192:255→ tile(3,0,0:63)

Layout of tile in memory

(51) Int. Cl.
*H04N 19/176* (2014.01)
*H04L 29/06* (2006.01)
*G06N 3/02* (2006.01)

(58) Field of Classification Search
CPC ...... H04N 19/59; H04N 19/625; H04N 19/70; H04N 19/89; H04N 21/23406; H04N 21/23418; H04N 21/23439; H04N 21/25825; H04N 21/25858; H04N 21/44209; H04N 21/4621; H04N 21/6131; H04N 21/6379; H04N 7/12; H04N 19/182; H04N 19/91; G06N 3/08; G06N 3/04; G06N 3/0436; G06N 3/0445; G06N 3/0454; G06N 3/10; G06N 5/025; G06N 3/02; G06F 11/30; G06F 15/17343; G06F 17/2264; G06F 17/241; G06F 17/2715; G06F 17/2785; G06F 17/2881; G06F 17/5009; G06F 9/30032; G06F 9/30036; G06F 9/30043; G06T 11/005; G06T 11/006; G06T 11/008; G06T 2207/10081; G06T 3/4046; G06T 3/4076; G06T 5/002; G06T 5/50; G06T 9/007; H04L 27/0004; H04L 29/06; H04L 29/06027; H04L 65/1096; H04L 65/4076; H04L 65/4084; H04L 65/604; H04L 65/607; H04L 65/80; H04L 67/303; H04L 69/04; H04L 69/329; H03M 7/3066; H03M 7/3071; H03M 7/40; H03M 7/46
See application file for complete search history.

(56) References Cited

U.S. PATENT DOCUMENTS

| | | | | |
|---|---|---|---|---|
| 2004/0252760 | A1* | 12/2004 | Winger | H04N 19/105 375/240.12 |
| 2011/0142133 | A1* | 6/2011 | Takahashi | H04N 19/52 375/240.16 |
| 2011/0216834 | A1* | 9/2011 | Zhou | H04N 7/12 375/240.24 |
| 2014/0286414 | A1* | 9/2014 | Nakamura | H04N 19/176 375/240.12 |
| 2015/0278642 | A1* | 10/2015 | Chertok | G06N 3/02 382/156 |
| 2019/0035118 | A1* | 1/2019 | Zhao | G06T 3/4046 |

OTHER PUBLICATIONS

Toderici G., et al., "Variable Rate Image Compression with Recurrent Neural Networks", Published as a Conference Paper at ICLR, Mar. 1, 2016, pp. 1-12.

* cited by examiner

410

| 1 | 1 | 1 | 0 | 0 |
|---|---|---|---|---|
| 0 | 1 | 1 | 1 | 0 |
| 0 | 0 | 1 | 1 | 1 |
| 0 | 0 | 1 | 1 | 0 |
| 0 | 1 | 1 | 0 | 0 |

| 1 | 0 | 1 |
|---|---|---|
| 0 | 1 | 0 |
| 1 | 0 | 1 |

Tile is arranged in 256B of memory:
- bytes 0:63 → tile(0,0,0:63)
- bytes 64:127 → tile(1,0,0:63)
- bytes 128:191→ tile(2,0,0:63)
- bytes 192:255→ tile(3,0,0:63)
Assume 3D tile with dimensions (X,Y,Z) = (2,2,64) → 128B, assuming 8bpp
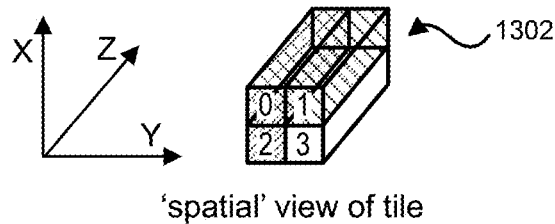
'spatial' view of tile
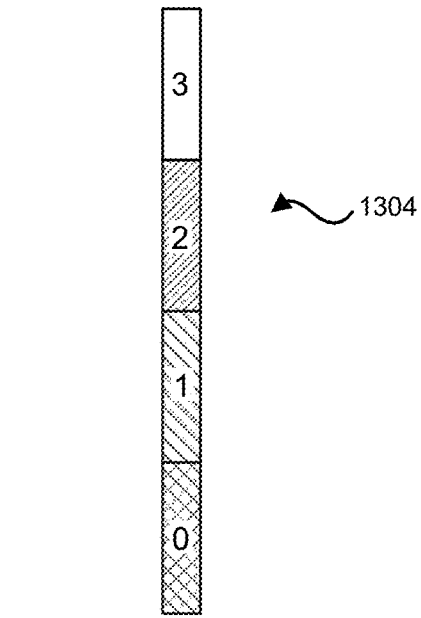
Layout of tile in memory
FIG. 13A     FIG. 13B

BANDWIDTH COMPRESSION FOR NEURAL NETWORK SYSTEMS

FIELD

The present disclosure generally relates to reducing an amount of data needed in neural network systems, and more specifically to performing bandwidth compression for data of neural network systems.

BACKGROUND

An artificial neural network attempts to replicate, using computer technology, logical reasoning performed by the biological neural networks that constitute animal brains. Deep neural networks, such as convolutional neural networks, are widely used for numerous applications, such as object detection, object classification, object tracking, big data analysis, among others. For example, convolutional neural networks are able to extract high-level features, such as facial shapes, from an input image, and use these high-level features to output a probability that, for example, an input image includes a particular object.

BRIEF SUMMARY

In some examples, systems and techniques are described for compressing bandwidth for data of neural network systems. For neural network pipeline processing, large amounts of raw data are typically accessed for processing by intermediate nodes of the neural network. For example, input data can be fetched by each layer of a neural network, and, after each layer is finished processing the input data for that layer, intermediate data and weighting factors are stored. The stored data is then fetched for processing by the subsequent layers in the neural network. In some cases, for the intermediate layers of a neural network, either 8 bit or 16 bit fixed or floating point operations are performed, which requires a large memory access burden (for both internal memory and external memory). Such data access requires high bandwidth usage, which leads to largely complex processing requirements and high power consumption.

The systems and techniques described herein utilize a neural network device or a neural network hardware component of a device (e.g., a neural processing unit (NPU)) that can perform bandwidth compression for neural network data processed by the NPU. For instance, to reduce memory access bandwidth requirement for neural network data, data from intermediate nodes in the neural network can be compressed (e.g., in a lossless manner). In some cases, given a block of neural network data (e.g., activation data from a hidden layer), a prediction scheme can be applied to each sample of the neural network data and residual data can be determined based on the prediction scheme. The residual data can then be compressed (or coded) using a coding technique, such as variable-length coding (VLC), arithmetic coding, other type of entropy coding, or other suitable coding technique.

According to at least one example, a method of compressing data in a neural network is provided. The method includes obtaining output data from a node of the neural network. The method further includes generating re-arranged output data having a re-arranged scanning pattern. The re-arranged output data is generated by re-arranging the output data into the re-arranged scanning pattern. The method further includes determining one or more residual values for the re-arranged output data. The one or more residual values are determined by applying a prediction mode to the re-arranged output data. The method further includes compressing the one or more residual values using a coding mode.

In another example, an apparatus for compressing data in a neural network is provided that includes a processor and a memory configured to store neural network data. The processor is configured to and can obtain output data from a node of the neural network. The processor is further configured to and can generate re-arranged output data having a re-arranged scanning pattern. The re-arranged output data is generated by re-arranging the output data into the re-arranged scanning pattern. The processor is further configured to and can determine one or more residual values for the re-arranged output data. The one or more residual values are determined by applying a prediction mode to the re-arranged output data. The processor is further configured to and can compress the one or more residual values using a coding mode.

In another example, a non-transitory computer-readable medium is provided that has stored thereon instructions that, when executed by one or more processors, cause the one or more processor to: obtaining output data from a node of the neural network; generating re-arranged output data having a re-arranged scanning pattern, wherein the re-arranged output data is generated by re-arranging the output data into the re-arranged scanning pattern; determining one or more residual values for the re-arranged output data, the one or more residual values being determined by applying a prediction mode to the re-arranged output data; and compressing the one or more residual values using a coding mode.

In another example, an apparatus for compressing data in a neural network is provided. The apparatus includes means for obtaining output data from a node of the neural network. The apparatus further includes means for generating re-arranged output data having a re-arranged scanning pattern. The re-arranged output data is generated by re-arranging the output data into the re-arranged scanning pattern. The apparatus further includes means for determining one or more residual values for the re-arranged output data. The one or more residual values are determined by applying a prediction mode to the re-arranged output data. The apparatus further includes means for compressing the one or more residual values using a coding mode.

In some aspects, determining the one or more residual values for the re-arranged output data can include: determining one or more predictors based on the prediction mode applied to the re-arranged output data; and determining the one or more residual values using the one or more predictors.

In some aspects, the prediction mode can include one or more of a minimum-maximum prediction mode, a spatial prediction mode, and a non-prediction mode, where no prediction is performed in the non-prediction mode. In some cases, the method, apparatuses, and computer-readable medium described above can further comprise selecting the prediction mode from among the minimum-maximum prediction mode, the spatial prediction mode, and the non-prediction mode based on the output data from the node of the neural network.

In some aspects, the prediction mode can include a minimum-maximum prediction mode.

In such aspects, applying the minimum-maximum prediction mode can include: determining a minimum value of the re-arranged output data; determining a maximum value of the re-arranged output data; selecting the minimum value or the maximum value as a predictor for each data sample in the re-arranged output data; and determining a residual value for each data sample using a predictor of each data sample and a residual value of each data sample.

In some aspects, the minimum value can be selected as a predictor for a data sample in the re-arranged output data if a difference between a value of the data sample and the minimum value is greater than a difference between the maximum value and the value of the data sample. In some aspects, the maximum value can be selected as a predictor for a data sample in the re-arranged output data if a difference between a value of the data sample and the minimum value is not greater than a difference between the maximum value and the value of the data sample.

In some aspects, the output data is in three dimensions, and the re-arranged scanning pattern of the re-arranged output data is in two dimensions.

In some cases, the minimum value and the maximum value can be obtained while performing the re-arranging operation described above. For example, the minimum value and the maximum value of the re-arranged data can be determined while performing the re-arranging operation, and the minimum value or the maximum value of the re-arranged data can be used as the predictor.

In some aspects, the coding mode includes run-length coding with variable length coding.

In some aspects, the apparatus includes a mobile device. The mobile device can include a display, a camera for capturing one or more images, and/or other components. For example, the mobile device can include a camera for capturing one or more images, and the output data can be generated based on the one or more images. In some examples, the mobile device can include a display for displaying the one or more images.

This summary is not intended to identify key or essential features of the claimed subject matter, nor is it intended to be used in isolation to determine the scope of the claimed subject matter. The subject matter should be understood by reference to appropriate portions of the entire specification of this patent, any or all drawings, and each claim.

The foregoing, together with other features and embodiments, will become more apparent upon referring to the following specification, claims, and accompanying drawings.

BRIEF DESCRIPTION OF THE DRAWINGS

Illustrative embodiments of the present application are described in detail below with reference to the following drawing figures:

FIG. 4A, FIG. 4B, and FIG. 4C are diagrams illustrating a simple example of a convolution.

FIG. 13A is a diagram illustrating a spatial view of a three-dimensional tile of neural network data.

FIG. 13B is a diagram illustrating a layout of the three-dimensional tile shown in FIG. 13A in memory.

DETAILED DESCRIPTION

Figure 1:
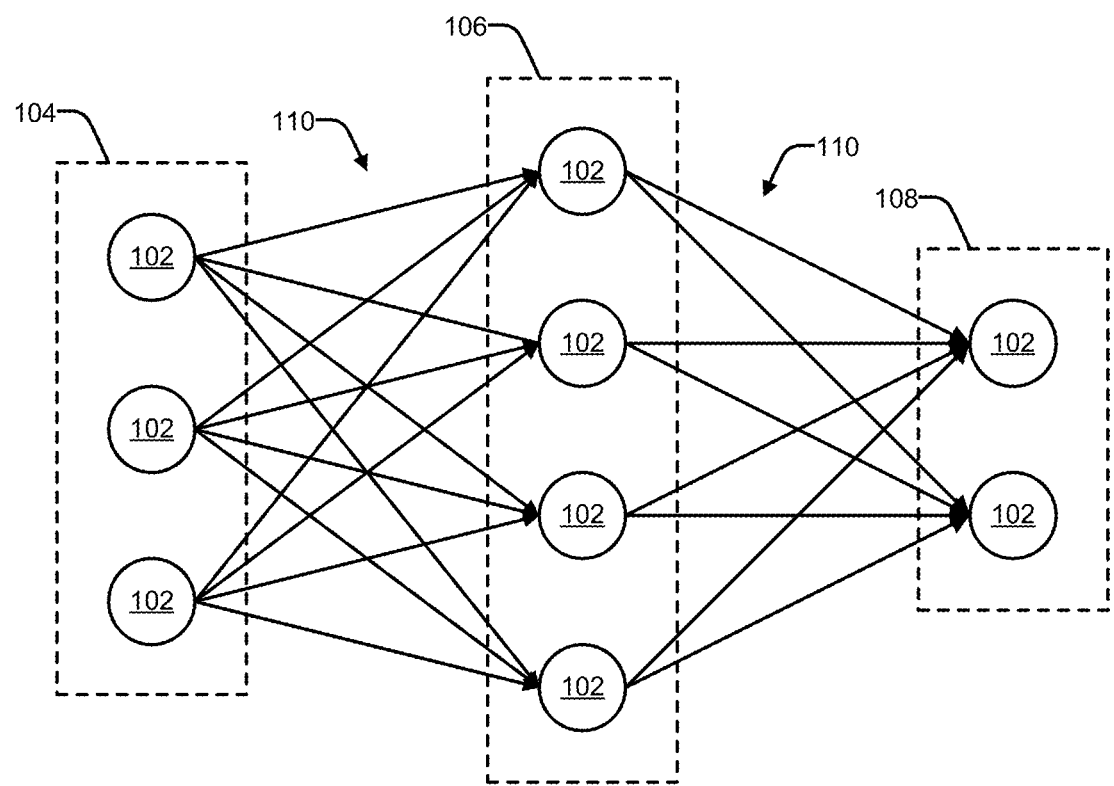
FIG. 1 is a diagram illustrating an example of a visual model for a neural network.

Certain aspects and embodiments of this disclosure are provided below. Some of these aspects and embodiments may be applied independently and some of them may be applied in combination as would be apparent to those of skill in the art. In the following description, for the purposes of explanation, specific details are set forth in order to provide a thorough understanding of embodiments of the application. However, it will be apparent that various embodiments may be practiced without these specific details. The figures and description are not intended to be restrictive.

The ensuing description provides exemplary embodiments only, and is not intended to limit the scope, applicability, or configuration of the disclosure. Rather, the ensuing description of the exemplary embodiments will provide those skilled in the art with an enabling description for implementing an exemplary embodiment. It should be understood that various changes may be made in the function and arrangement of elements without departing from the spirit and scope of the application as set forth in the appended claims.

Specific details are given in the following description to provide a thorough understanding of the embodiments. However, it will be understood by one of ordinary skill in the art that the embodiments may be practiced without these specific details. For example, circuits, systems, networks, processes, and other components may be shown as components in block diagram form in order not to obscure the embodiments in unnecessary detail. In other instances, well-known circuits, processes, algorithms, structures, and techniques may be shown without unnecessary detail in order to avoid obscuring the embodiments.

Also, it is noted that individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process is terminated when its operations are completed, but could have additional steps not included in a figure. A process may correspond to a method, a function, a procedure, a subroutine, a subprogram, etc. When a process corresponds to a function, its termination can correspond to a return of the function to the calling function or the main function.

The term "computer-readable medium" includes, but is not limited to, portable or non-portable storage devices, optical storage devices, and various other mediums capable of storing, containing, or carrying instruction(s) and/or data. A computer-readable medium may include a non-transitory medium in which data can be stored, in which case the data is not stored via carrier waves and/or transitory electronic signals. Examples of a non-transitory medium may include, but are not limited to, a magnetic disk or tape, optical storage media such as compact disk (CD) or digital versatile disk (DVD), flash memory, memory or memory devices. A computer-readable medium may have stored thereon code and/or machine-executable instructions that may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, or the like.

Furthermore, embodiments may be implemented by hardware, software, firmware, middleware, microcode, hardware description languages, or any combination thereof. When implemented in software, firmware, middleware or microcode, the program code or code segments to perform the necessary tasks (e.g., a computer-program product) may be stored in a computer-readable or machine-readable medium. A processor(s) may perform the necessary tasks.

An artificial neural network attempts to replicate, using computer technology, logical reasoning performed by the biological neural networks that constitute animal brains. Neural networks fall within a sub-field of artificial intelligence called machine learning. Machine learning is a field of study that investigates giving computers the ability to learn without being explicitly programmed. A software program that is explicitly programmed must account for all possible inputs, scenarios, and outcomes. In contrast, a software program that uses machine learning algorithms learns by being given inputs and receiving feedback as to the correctness of the output the program produces. The feedback is incorporated into the program, so that the program can produce a better result for the same or similar input.

Neural networks take inspiration from the mechanics of the operation of the human brain, to the extent that these operations are understood. According to various models of the brain, the main computational element of the brain is the neuron. Neurons are connected together with a number of elements, with elements entering a neuron being referred to as dendrites and an element leaving a neuron being referred to as an axon. A neuron accepts signals via dendrites, performs a computation on the signals, and outputs a signal on an axon. The input and output signals are referred to as activations. The axon of one neuron can branch out and be connected to the dendrites of multiple neurons. The connection between a branch of an axon and a dendrite is called a synapse.

A synapse can scale the signal crossing the synapse. The scaling factor is referred to as a weight, and is thought of as the way a brain is able to learn: different weights result from different responses to input. Learning can change the weights, but the organization of the neurons and synapses need not change to obtain the learning. The static structure of the brain can thus be used as a model for a program, and the weights can reflect a task or tasks that the program has learned to perform.

Neural networks operate on the notion that a neuron's computation involves a weighted sum of input values. These weighted sums correspond to the value scaling performed by the synapses and the combining of those values in the neuron. A functional operation is performed in the neuron on the combined inputs. In the brain model, the operation appears to be a non-linear function that causes the neuron to generate an output only when the inputs cross some threshold. Thus, by analogy, a node of a neural network can apply a non-linear function to the weighted sum of the values input into the node.

FIG. 1 is a diagram illustrating an example of a visual model 100 for a neural network. In this example, the model 100 includes an input layer 104, a middle layer that is often referred to as a hidden layer 106, and an output layer 108. Each layer includes some number of nodes 102. In this example, each node 102 of the input layer 104 is connected to each node 102 of the hidden layer 106. The connections, which would be referred to as synapses in the brain model, are referred to as weights 110. The input layer 104 can receive inputs and can propagate the inputs to the hidden layer 106. Also in this example, each node 102 of the hidden layer 106 has a connection or weight 110 with each node 102 of the output layer 108. In some cases, a neural network implementation can include multiple hidden layers. Weighted sums computed by the hidden layer 106 (or multiple hidden layers) are propagated to the output layer 108, which can present final outputs for different uses (e.g., providing a classification result, detecting an object, tracking an object, and/or other suitable uses). The outputs of the different nodes 102 (weighted sums) can be referred to as activations (also referred to as activation data), in keeping with the brain model.

An example of a computation that can occur at each layer in the example visual model 100 is as follows:

$$y_j = f\left(\sum_{i=1}^{3} W_{ij} \times x_i + b\right)$$

In the above equation, $W_{ij}$ is a weight, $x_1$ is an input activation, $y_j$ is an output activation, $f(\ )$ is a non-linear function, and b is a bias term. Using an input image as an example, each connection between a node and a receptive field for that node can learn a weight $W_{ij}$ and, in some cases, an overall bias b such that each node learns to analyze its particular local receptive field in the input image. Each node of a hidden layer can have the same weights and bias (called a shared weight and a shared bias). Various non-linear functions can be used to achieve different purposes.

The model 100 can be referred to as a directed, weighted graph. In a directed graph, each connection to or from a node indicates a direction (e.g., into the node or away from the node). In a weighted graph, each connection can have a weight. Tools for developing neural networks can visualize the neural network as a directed, weighted graph, for ease of understanding and debuggability. In some cases, these tools can also be used to train the neural network and output trained weight values. Executing the neural network is then a matter of using the weights to conduct computations on input data.

A neural network that has more than three layers (e.g., more than one hidden layer) is sometimes referred to as a deep neural network. Deep neural networks can have, for example, five to more than a thousand layers. Neural networks with many layers can be capable of learning high-level tasks that have more complexity and abstraction than shallower networks. As an example, a deep neural network can be taught to recognize objects or scenes in images. In this example, pixels of an image can be fed into the input layer of the deep neural network, and the outputs of the first layer can indicate the presences of low-level features in the image, such as lines and edges. At subsequent layers, these features can be combined to measure the likely presence of higher level features: the lines can be combined into shapes, which can be further combined into sets of shapes. Given such information, the deep neural network can output a probability that the high-level features represent a particular object or scene. For example, the deep neural network can output whether an image contains a cat or does not contain a cat.

The learning phase of a neural network is referred to as training the neural network. During training, the neural network is taught to perform a task. In learning the task, values for the weights (and possibly also the bias) are determined. The underlying program for the neural network (e.g., the organization of nodes into layers, the connections between the nodes of each layer, and the computation executed by each node), does not need to change during training. Once trained, the neural network can perform the task by computing a result using the weight values (and bias values, in some cases) that were determined during training. For example, the neural network can output the probability that an image contains a particular object, the probability that an audio sequence contains a particular word, a bounding box in an image around an object, or a proposed action that should be taken. Running the program for the neural network is referred to as inference.

There are multiple ways in which weights can be trained. One method is called supervised learning. In supervised learning, all training samples are labeled, so that inputting each training sample into a neural network produces a known result. Another method is called unsupervised learning, where the training samples are not labeled. In unsupervised learning, training aims to find a structure in the data or clusters in the data. Semi-supervised learning falls between supervised and unsupervised learning. In semi-supervised learning, a subset of training data is labeled. The unlabeled data can be used to define cluster boundaries and the labeled data can be used to label the clusters.

Figure 2A:
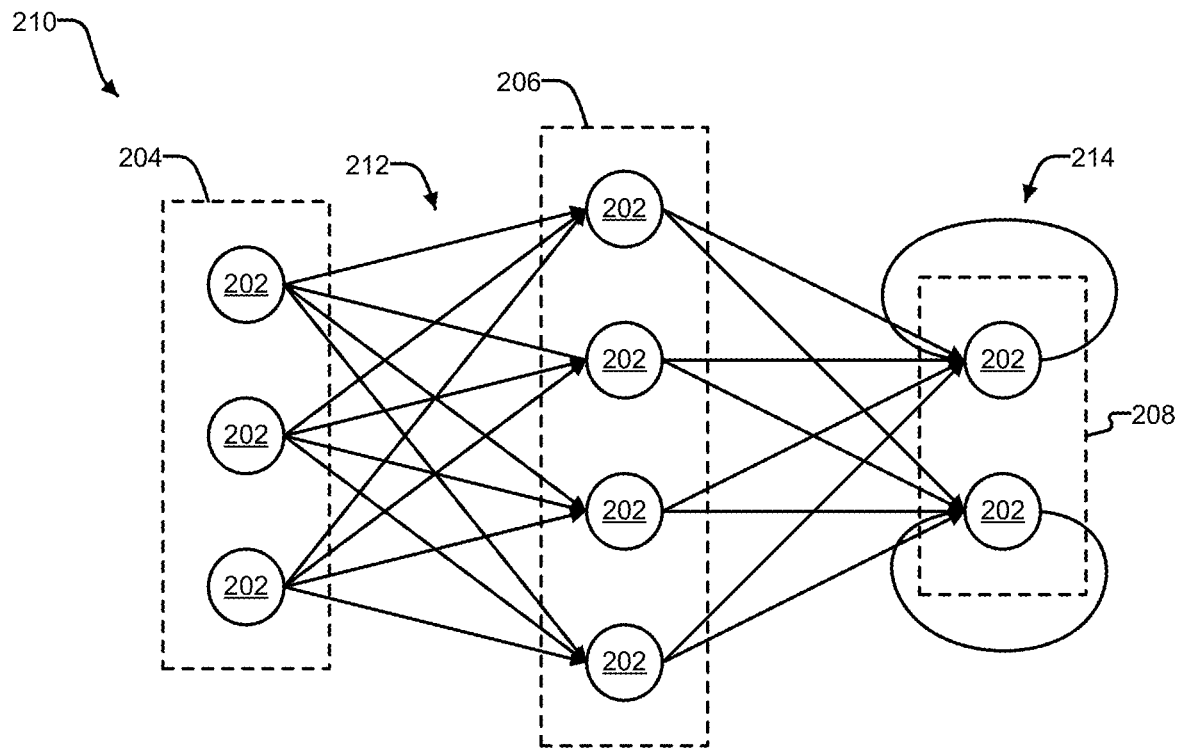
FIG. 2A is a diagram illustrating an example of a model for a neural network that includes feed-forward weights and recurrent weights.

Different varieties of neural networks have been developed. Various examples of neural networks can be divided into two forms: feed-forward and recurrent. FIG. 2A is a diagram illustrating an example of a model 210 for a neural network that includes feed-forward weights 212 between an input layer 204 and a hidden layer 206, and recurrent weights 214 at the output layer 208. In a feed-forward neural network, the computation is a sequence of operations on the outputs of a previous layer, with the final layer generating the outputs of the neural network. In the example illustrated in FIG. 2A, feed-forward is illustrated by the hidden layer 206, whose nodes 202 operate only on the outputs of the nodes 202 in the input layer 204. A feed-forward neural network has no memory and the output for a given input can be always the same, irrespective of any previous inputs given to the neural network. The Multi-Layer Perceptron (MLP) is one type of neural network that has only feed-forward weights.

In contrast, recurrent neural networks have an internal memory that can allow dependencies to affect the output. In a recurrent neural network, some intermediate operations can generate values that are stored internally and that can be used as inputs to other operations, in conjunction with the processing of later input data. In the example of FIG. 2A, recurrence is illustrated by the output layer 208, where the outputs of the nodes 202 of the output layer 208 are connected back to the inputs of the nodes 202 of the output layer 208. These looped-back connections can be referred to as recurrent weights 214. Long Short-Term Memory (LSTM) is a frequently used recurrent neural network variant.

Figure 2B:
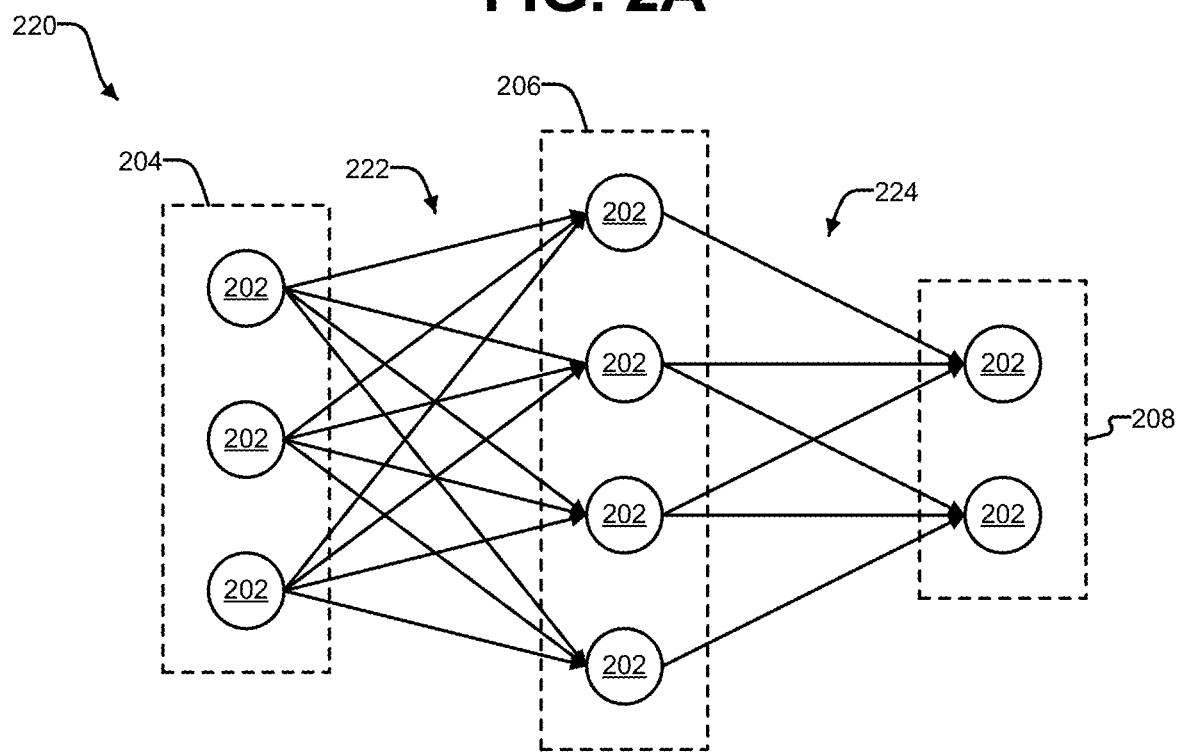
FIG. 2B is a diagram illustrates an example of a model for a neural network that includes different connection types.

FIG. 2B is a diagram illustrating an example of a model 220 for a neural network that includes different connection types. In this example model 220, the input layer 204 and the hidden layer 206 are fully connected 222 layers. In a fully connected layer, all output activations are composed of the weighted input activations (e.g., the outputs of all the nodes 202 in the input layer 204 are connected to the inputs of all the nodes 202 of the hidden layer 206). Fully connected layers can require a significant amount of storage and computations. Multi-Layer Perceptron neural networks are one type of neural network that is fully connected.

In some applications, some connections between the activations can be removed, for example by setting the weights for these connections to zero, without affecting the accuracy of the output. The result is sparsely connected 224 layers, illustrated in FIG. 2B by the weights between the hidden layer 206 and the output layer 208. Pooling is another example of a method that can achieve sparsely connected 224 layers. In pooling, the outputs of a cluster of nodes can be combined, for example by finding a maximum value, minimum value, mean value, or median value.

A category of neural networks referred to as convolutional neural networks (CNNs) have been particularly effective for image recognition and classification. A convolutional neural network can learn, for example, categories of images, and can output a statistical likelihood that an input image falls within one of the categories.

Figure 3:
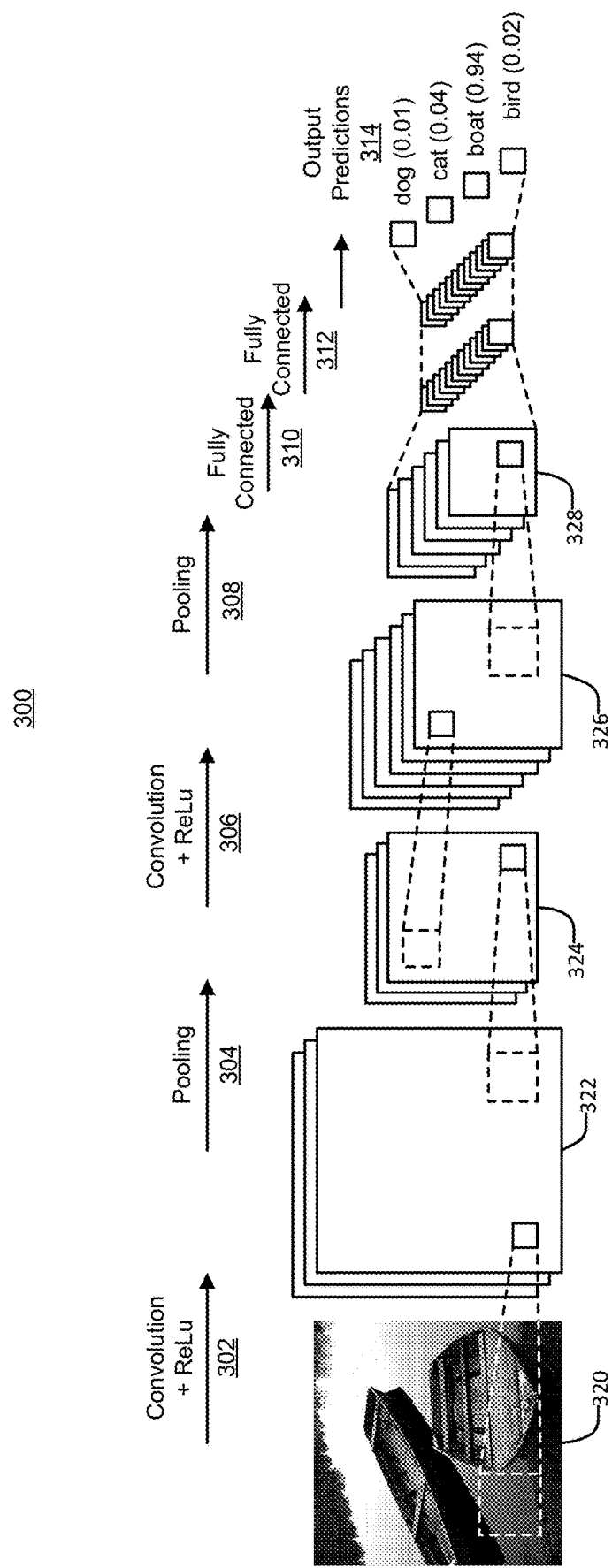
FIG. 3 is a diagram illustrating a detailed example of a model for a convolutional neural network.

FIG. 3 is a diagram illustrating an example of a model 300 for a convolutional neural network. The model 300 illustrates operations that can be included in a convolutional neural network: convolution, activation, pooling (also referred to as sub-sampling), batch normalization, and output generation (e.g., a fully connected layer). As an example, the convolutional neural network illustrated by the model 300 is a classification network providing output predictions 314 of different classes of objects (e.g., dog, cat, boat, bird). Any given convolutional network includes at least one convolutional layer, and can have many convolutional layers. Additionally, each convolutional layer need not be followed by a pooling layer. In some examples, a pooling layer may occur after multiple convolutional layers, or may not occur at all. The example convolutional network illustrated in FIG. 3 classifies an input image 320 into one of four categories: dog, cat, boat, or bird. In the illustrated example, on receiving an image of a boat as input, the example neural network outputs the highest probability for "boat" (0.94) among the output predictions 314.

To produce the illustrated output predictions 314, the example convolutional neural network performs a first convolution with a rectified linear unit (ReLU) 302, pooling 304, a second convolution with ReLU 306, additional pooling 308, and then categorization using two fully-connected layers 310, 312. In the first convolution with ReLU 302 operation, the input image 320 is convolved to produce one or more output feature maps 322 (including activation data). The first pooling 304 operation produces additional feature maps 324, which function as input feature maps for the second convolution and ReLU 306 operation. The second convolution with ReLU 306 operation produces a second set of output feature maps 326 with activation data. The additional pooling 308 step also produces feature maps 328, which are input into a first fully-connected layer 310. The output of the first fully-connected layer 310 is input into a second fully-connect layer 312. The outputs of the second fully-connected layer 312 are the output predictions 314. In convolutional neural networks, the terms "higher layer" and "higher-level layer" refer to layers further away from the input image (e.g., in the example model 300, the second fully-connected 312 layer is the highest layer).

The example of FIG. 3 is one example of a convolutional neural network. Other examples can include additional or fewer convolution operations, ReLU operations, pooling operations, and/or fully-connected layers. Convolution, non-linearity (ReLU), pooling or sub-sampling, and categorization operations will be explained in greater detail below.

When conducting an image processing function (e.g., image recognition, object detection, object classification, object tracking, or other suitable function), a convolutional neural network can operate on a numerical or digital representation of the image. An image can be represented in a computer as a matrix of pixel values. For example, a video frame captured at 1080p includes an array of pixels that is 1920 pixels across and 1080 pixels high. Certain components of an image can be referred to as a channel. For example, a color image has three color channels: red (R), green (G), and blue (B) or luma (Y), chroma red (Cr), and chroma blue (Cb). In this example, a color image can be represented as three two-dimensional matrices, one for each color, with the horizontal and vertical axis indicating a location of a pixel in the image and a value between 0 and 255 indicating a color intensity for the pixel. As another example, a greyscale image has only one channel, and thus can be represented as a single two-dimensional matrix of pixel values. In this example, the pixel values can also be between 0 and 255, with 0 indicating black and 255 indicating white, for example. The upper value of 255, in these examples, assumes that the pixels are represented by 8-bit values. In other examples, the pixels can be represented using more bits (e.g., 16, 32, or more bits), and thus can have higher upper values.

As shown in FIG. 3, a convolutional network is a sequence of layers. Every layer of a convolutional neural network transforms one volume of activation data (also referred to as activations) to another volume of activation through a differentiable function. For example, each layer can accepts an input 3D volume and can transforms that input 3D volume to an output 3D volume through a differentiable function. Three types of layers that can be used to build convolutional neural network architectures can include convolutional layers, pooling layers, and one or more fully-connected layer. A network also includes an input layer, which can hold raw pixel values of an image. For example, an example image can have a width of 32 pixels, a height of 32 pixels, and three color channels (e.g., R, G, and B color channels). Each node of the convolutional layer is connected to a region of nodes (pixels) of the input image. The region is called a receptive field. In some cases, a convolutional layer can compute the output of nodes (also referred to as neurons) that are connected to local regions in the input, each node computing a dot product between its weights and a small region they are connected to in the input volume. Such a computation can result in volume [32×32×12] if 12 filters are used. The ReLu layer can apply an elementwise activation function, such as the max(0,x) thresholding at zero, which leaves the size of the volume unchanged at [32×32×12]. The pooling layer can perform a downsampling operation along the spatial dimensions (width, height), resulting in reduced volume of data, such as a volume of data with a size of [16×16×12]. The fully-connected layer can compute the class scores, resulting in volume of size [1×1×4], where each of the four (4) numbers correspond to a class score, such as among the four categories of dog, cat, boat, and bird. The CIFAR-10 network is an example of such a network, and has ten categories of objects. Using such a neural network, an original image can be transformed layer by layer from the original pixel values to the final class scores. Some layers contain parameters and others may not. For example, the convolutional and fully-connected layers perform transformations that are a function of the activations in the input volume and also of the parameters (the weights and biases) of the nodes, while the ReLu and pooling layers can implement a fixed function.

A convolution is a mathematical operation that can be used to extract features from an input image. Features that can be extracted include, for example, edges, curves, corners, blobs, and ridges, among others. Convolution preserves the spatial relationship between pixels by learning image features using small squares of input data.

Figure 4C:
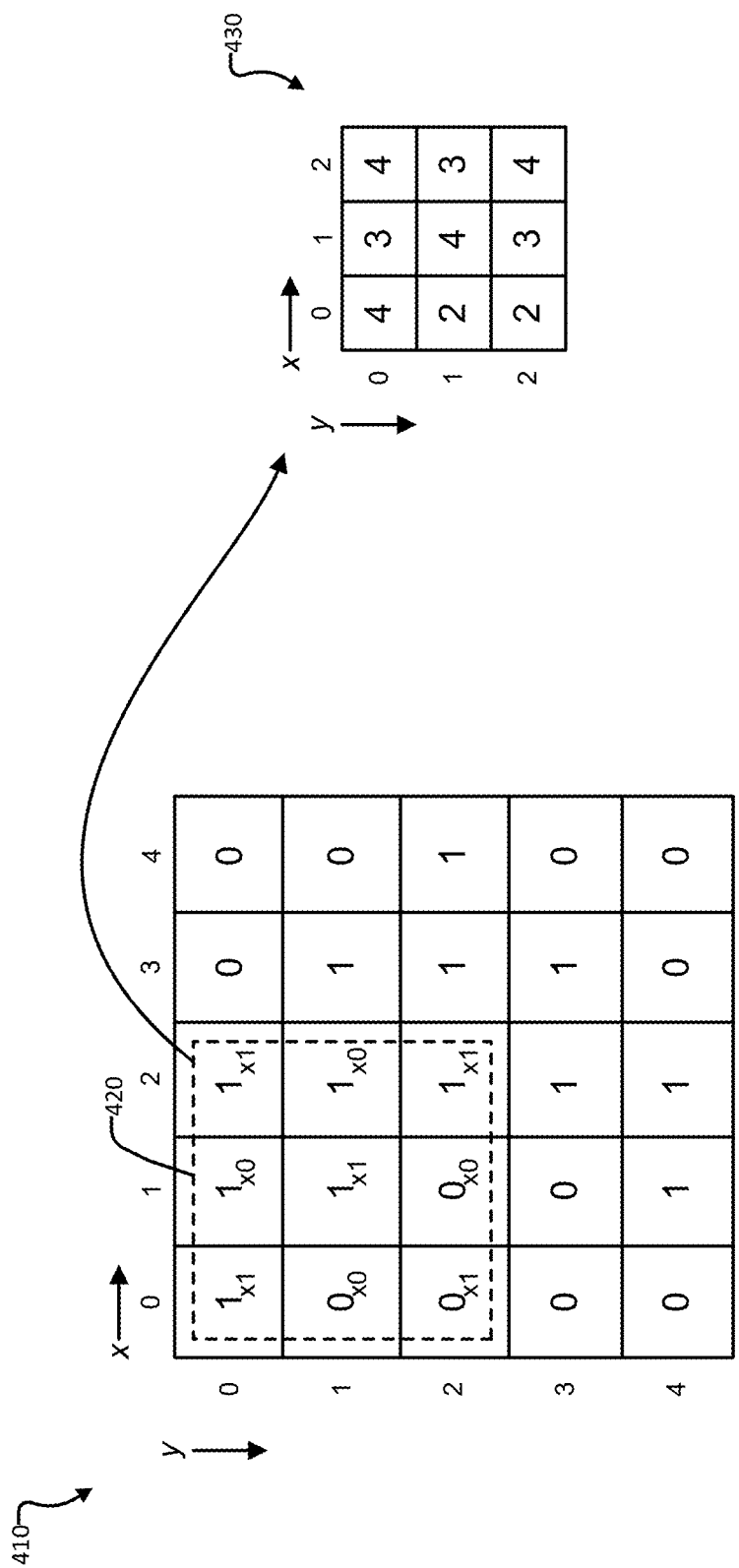

FIG. 4A, FIG. 4B, and FIG. 4C are diagrams illustrating a simple example of a convolutional operation. FIG. 4A illustrates an example input matrix 410 of pixel values. In this example, the input image represented by the input matrix 410 is five pixels wide by five pixels high. For purposes of this example, the pixel value are only 0 and 1. In other examples, the pixel values can range from 0 to 255, as discussed above. Because there is only one input matrix 410, the image has only one channel, and can be assumed to be a greyscale image.

FIG. 4B illustrates an example of a filter 420, which can also be referred to as a kernel or a feature detector. The filter 420 can be used to extract different features from the image, such as edges, curves, corners, and so on, by changing the numerical values in the matrix of the filter 420. In this simplified example, the matrix values are 0 or 1. In other examples, the matrix values can be greater than one, can be negative, and/or can be fractional.

FIG. 4C illustrates convolution of the input matrix 410 with the filter 420. The convolutional operation involves computing a value for each possible position of the filter 420 over the input matrix 410 by multiplying the input matrix 410 values and the filter 420 values and summing the resulting products. In one example, as shown in FIG. 4C, the filter 420 overlaps (x, y) positions (0, 0), (1, 0), (2, 0), (0, 1), (1, 1), (2, 1), (0, 2), (1, 2), and (2, 2) of the input matrix 410, which is called a receptive field of the filter. For instance, the value of the input matrix 410 at position (0, 0) is multiplied by the value of the filter 420 at position (0, 0) to produce a product of 1 (based on the product of 1×1). For each receptive field for the filter 420 in the input matrix, the multiplication is repeated for each position in the filter 420 that overlaps with a position in the input matrix 410. The products are then summed to produce a value of 4 for the illustrated filter position.

The value of 4 is placed at a position (0, 0) in a feature map 430, which can also be referred to as a convolved feature or an activation map, that includes activation data. The (0, 0) position corresponds to the filter's position, as illustrated in FIG. 4C. To obtain a value for position (1, 0)

in the feature map 430, the filter 420 is slid to the right by one pixel (referred to as a stride of one), and the multiply-add operation is repeated. To obtain a value for position (0, 1) in the feature map 430, the filter 420 can be moved to overlap positions (0, 1) through (2, 3) in the input matrix 410. Similar operations can be performed to obtain the values for the remaining positions in the feature map 430.

In examples that include more channels, the filter 420 can be applied to the input matrix 410 for each channel. For example, a color image can have three channels, and thus three input matrices. In this example, convolution of the three input matrices can thus result in three feature maps for each receptive field in the input matrix 410.

In practice, the filter values, which can also be referred to as weights, are determined during training of the neural network. Design of a convolutional neural network thus involves specifying factors such as the number of filters to use, the filter size, and the architecture of the network, including the number of layers and the operation executed in each layer.

The size of the feature maps can be controlled by three parameters: depth, stride, and zero-padding. Depth corresponds to the number of filters used in a convolutional operation. Applying more filters can result in more features being extracted, and the neural network possibly being able to produce a more accurate identification. Each additional filter, however, increases the number of computations that need to be performed. Additionally, each filter results in a separate feature map, which requires additional storage space. A set of feature maps extracted in the same convolutional network can be thought of as a stack of two-dimensional matrices, sometimes collectively referred to as a single feature map, in which case the depth of the feature map is the number of the two-dimensional matrices.

The stride is the number of samples (e.g., pixels) by which a filter matrix is moved across an input matrix. In the example of FIG. 4C, the filter 420 matrix is moved by one pixel at a time, thus the stride is equal to one. As one illustrative example, when the stride of a filter is a value of two, the filter moves two pixels between convolutional computations. A larger stride results in a smaller feature map.

In the example of FIG. 4C, some information at the edges of the input matrix 410 may not be well captured. This is because, in this example, the filter is applied to some positions once (e.g., position (0, 0)) or twice (e.g., position (0, 1)), while the filter is applied four times to all other positions. In some cases, loss of edge information is acceptable. When it is not desirable to lose edge information, zero-padding may be applied, meaning that the input matrix is increased in size in all directions by the same amount of pixels and the new positions are given a value of zero. Zero-padding can also be used to control the size of the feature maps. Addition of zero-padding can be referred to as wide convolution, while not using zero-padding can be referred to as narrow convolution.

In some cases, an operation referred to as ReLU is applied to a feature map. ReLU, which stands for Rectified Linear Unit, is one type of activation layer. ReLU is a non-linear operation, whose output can be given by:

Output=Max(0,Input)

ReLU is an element-wise operation applied to each pixel. ReLU replaces all negative pixel values in a feature map by zero. Convolution is a linear operation including element-wise matrix multiplication and addition. ReLU introduces non-linearity into a convolutional neural network on the assumption that most of the real-world data the convolutional neural network is to learn about is non-linear. Other non-linear functions can be used, such as tan h or sigmoid.

A convolutional neural network can also include pooling, which can also be referred to as sub-sampling or down sampling. Pooling reduces the dimensionality of a feature map while retaining the most important information. Various pooling functions can be used, such as max, average, sum, and others.

Figure 5:
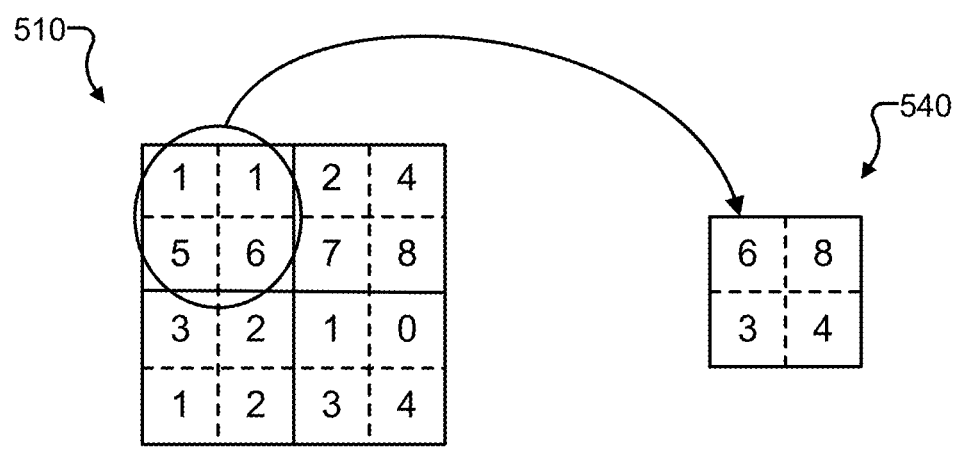
FIG. 5 is a diagram illustrating an example of max pooling applied to a rectified feature map.

FIG. 5 is a diagram illustrating an example of max pooling applied to a rectified feature map 510; that is, a feature map to which ReLU or another non-linear function has been applied. In the example of FIG. 5, a spatial neighborhood of two pixels wide by two pixels high has been defined. Within the 2×2 window, the maximum value is taken and placed in the pooled feature map 540. Also in this example, the window is moved by two pixels (also referred to as a stride of two) for each max operation, resulting in the 4×4 rectified feature map 510 being reduced to a 2×2 pooled feature map 540. In other examples, an average of the values in the window can be computed for the pooled feature map 540, or a sum, or some other computation. Max pooling is most commonly used.

When a pooling operation is applied, the operation is applied separately to each feature map output from a convolutional layer (or a convolution and ReLU layer). The number of pooled feature maps from a pooling layer is thus the same as the number of feature maps that are input into the pooled layer.

A convolutional neural network can include pooling to progressively reduce the spatial size of the input representation. For example, pooling can make the input representations (e.g., the feature dimension) smaller and more manageable. As another example, pooling can reduce the number of parameters and computations that need to be performed by the neural network. As another example, pooling can make the neural network invariant to small transformations, distortions, or translations in the input image. That is, a small distortion in the input is not likely to change the output of the pooling, since the maximum (or average, or sum, or some other operation) is taken in a local neighborhood. As a further example, pooling can assist in determining an almost scale invariant representation of the image (referred to as an equivariant representation). This means that an object can be detected in an image no matter where the object is located within the image.

As illustrated by the example of FIG. 3, a convolutional neural network can include multiple convolutional layers, with each layer refining the features extracted by a previous layer. Each convolutional layer may be, but need not be, followed by pooling. The output of a combination of these layers represent high-level features of the input image, such as the presence of certain shapes, colors, textures, gradients, and so on.

To turn these feature maps into a classification, a convolutional neural network can include one or more fully-connected layers. In some cases, a Multi-Layer Perceptron that uses, for example, a softmax activation function can be used after a fully-connected layer. A fully-connected layer can classify the input image into various classes based on training data. For example, the convolutional neural network of FIG. 3 was trained to recognize dogs, cats, boats, and birds, and can classify objects in an input image as including one of these classes.

Apart from classification, a fully-connected layer in a convolutional neural network might also provide an inexpensive (in computational and/or data storage terms) way to learn non-linear combinations of the extracted features. The features extracted by the convolution and pooling layers may be good for making a classification, but a combination of the features may be better.

In the example of FIG. 3, the sum of the output predictions 314 is 1, due to the output layer using a softmax activation function. The softmax function takes a vector of arbitrary real-valued scores and compresses these values into a vector of values between zero and one that add up to one.

As noted above, the filter values are determined during training of the convolutional neural network. Training can be accomplished, for example, using a backpropagation technique. This technique involves, first, initializing all filter values and any related parameters with random values. Second, a training image can be input into the neural network. In this step, because the weights were randomly assigned, the output probabilities likely will also be random. For example, the output vector for the neural network of FIG. 3 might be [0.2, 0.4, 0.1, 0.3], representing the probability that the training image is a dog, cat, boat, or bird, respectively.

Next, a total error at the output layer can be calculated, as follows:

$$\text{Total Error} = \sum \frac{(\text{target probablity} - \text{output probablity})^2}{2}$$

In the above equation, the target probability is a vector representing the desired outcome. For example, for the input image 320 illustrated in FIG. 3, the target probabilities is [0, 0, 1, 0].

The fourth step is to use backpropagation to calculate gradients of error with respect to all weights in the neural network. Further, gradient descent can be used to update all filter values or weights and parameter values, to minimize the output error. For example, a weight can be adjusted in proportion to the weight's contribution to the total error. When the same training image is input again, the output vector might be closer to the target probabilities. Back propagation can be repeated until the output vector is within a desired range of the target probability. The training steps can further be repeated for each image in a training data set.

In the training processes, parameters such as the number of filters, the filter sizes, and the organization of the layers remain unchanged. During training, only the values of the filter matrices and connection weights are changed.

Research has found that the more convolution steps a neural network has, the more features the network will be able to learn to recognize. For example, in an image classification example, in a first layer, the neural network may learn to detect edges from the raw pixels, then in a second layer use the edges to detect shapes, and in a third layer, the neural network may be able to use the shapes to determine higher-level features, such as facial shapes, in higher layers.

Figure 6:
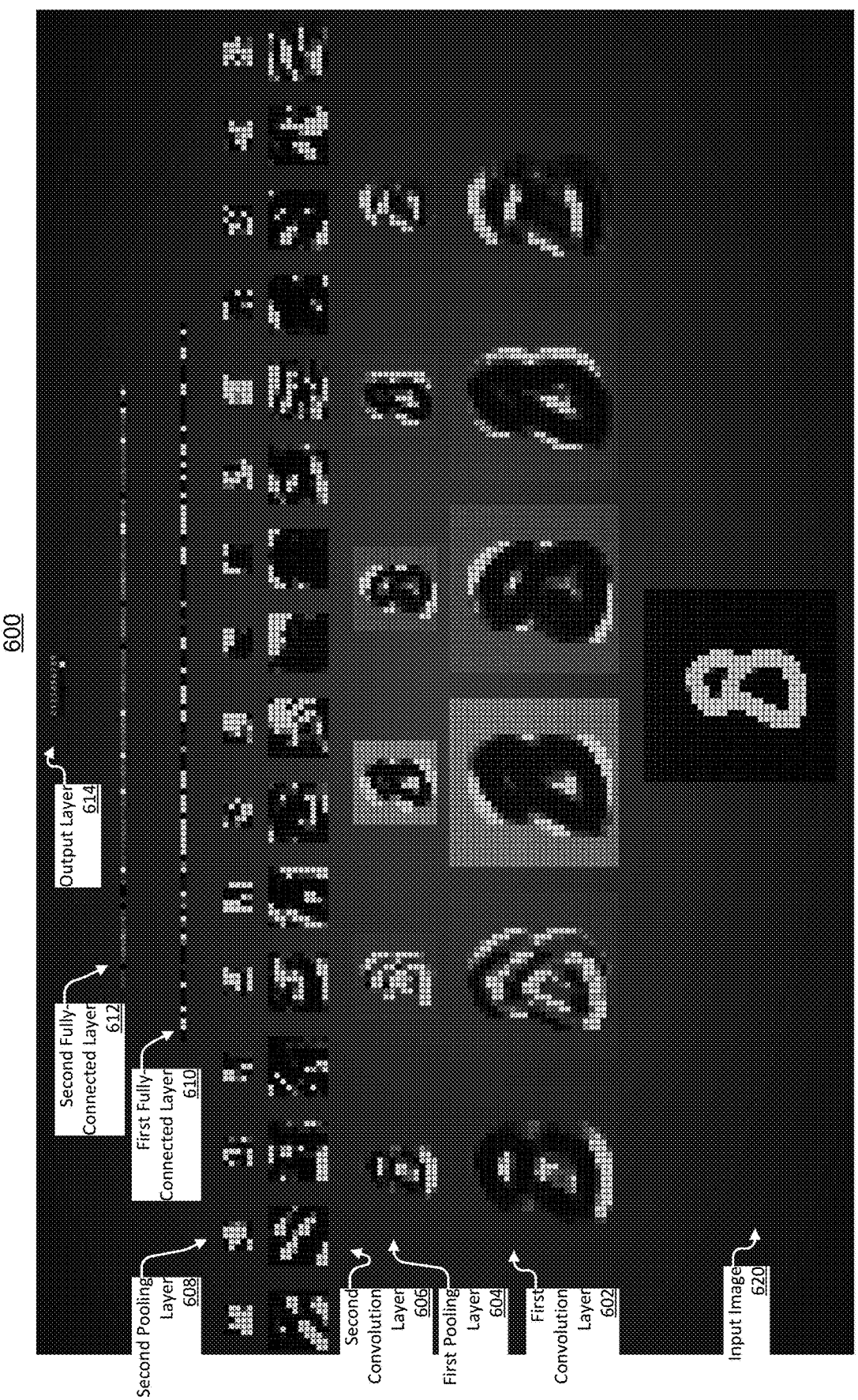
FIG. 6 illustrates an example visualization of a convolutional neural network that has been trained to recognize numbers.

FIG. 6 illustrates an example visualization 600 of a convolutional neural network that has been trained to recognize numbers. In this example, the ReLU operation is not shown separately. In the example of FIG. 6, the input image 620 is 32 pixels high and 32 pixels wide. The first convolutional layer 602 performs a convolution on the input image 620 using six different 5×5 filters applied with a stride of one. The output of the first convolutional layer 602 is a feature map with a depth of six.

The first convolutional layer 602 is followed by a first pooling layer 604. The first pooling layer 604 executes 2×2 max pooling with a stride of two over each of the six feature maps produced by the first convolutional layer 602. The output of the first pooling layer 604 is six feature maps that have a lower resolution than the input feature maps, but that more distinctly identify a feature. For example, use of the max function means that the pixels having the maximum value (e.g. the brightest pixel) in each 2×2 region of the input feature maps is put into the output feature maps.

The first pooling layer is followed by a second convolutional layer 606. In the second convolutional layer 606, sixteen 5×5 filters are applied with a stride of 1, producing an output feature map with a depth of 16. A second pooling layer 608 does 2×2 max pooling with a stride of two, similar to the first pooling layer 604.

The convolutional neural network used to generate the visualization 600 next has three fully-connected layers, including the output layer 614. The fully-connected layers can be used to categorize the outputs (in this example) of the second pooling layer 608. In the example of FIG. 6, the first fully-connected layer 610 has 120 nodes or neurons and the second fully-connected layer has 100 nodes. The output layer 614 has 10 neurons that correspond to the ten possible digits the network was trained to recognize. Though not illustrated here, because the layers are fully-connected, each node of the first fully-connected layer 610 is connected to each node in the second fully-connected layer 612. Similarly, each node in the second fully-connected layer 612 is connected to each node in the output layer 614.

To categorize the input image 620, in the illustrated example, first fully-connect layer 610 can treat the two-dimensional inputs as a single list of values. The training process may have determined that some values from the list are more accurate at predicting a category, and these values are given a higher weight, which are assigned at the inputs of the nodes of the first fully-connected layer 610. Each node of the first fully-connect layer 610 can thus produce a weighted sum of the inputs to the node. The second fully-connected layer 612 conducts a similar process with the list of values output from the first fully-connected layer 610. The second fully-connected layer 612 can also assign weights to the inputs of each node in the layer. The output layer 614 also conducts a similar process. The brightest node (e.g., having the highest value) in the output layer 614 corresponds to the number 8, indicating that the neural network has correctly identified the numeral drawn in the input image 620.

As can be seen in the example of FIG. 6, higher-level feature maps in a convolutional neural network have a stronger semantic representation, meaning that the higher-level feature maps can identify a more complex feature (e.g., a facial shape as opposed to an edge). The higher-level features maps, however, may lose spatial information that can enable a convolutional neural network to correctly identify some objects, such as small objects. For example, as can be seen in FIG. 6, due to the filtering and pooling operations, higher-level feature maps have a lower resolution (e.g., fewer pixels per feature map) than do the lower-level feature maps. Having a lower resolution may mean that a higher-level feature map more definitively identifies a feature, but may also mean that the location of the feature within the input image is not clear.

Figure 7:
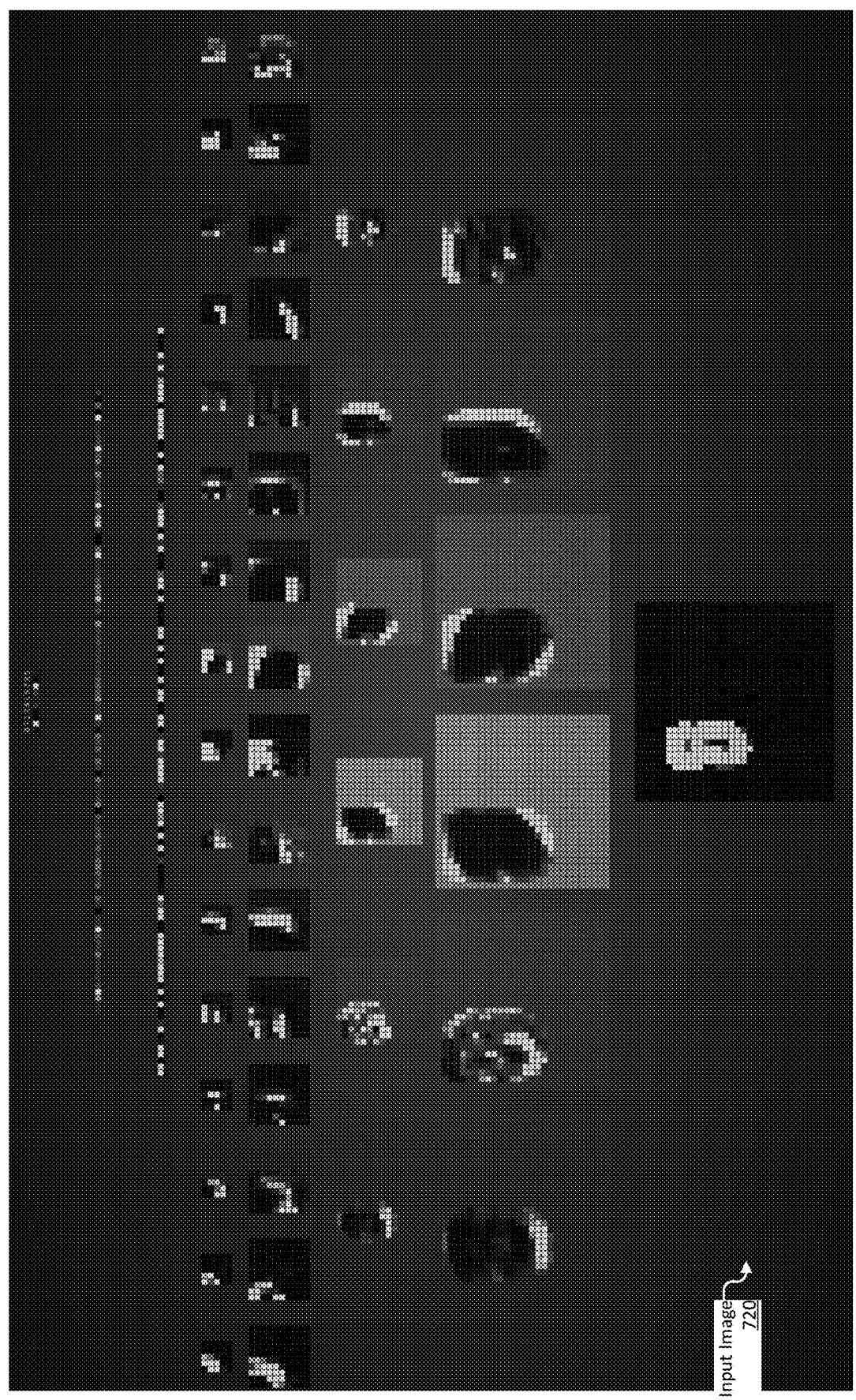
FIG. 7 illustrates a visualization in which a neural network has incorrectly identified an input.

FIG. 7 illustrates a visualization 700 using the same neural network used to produce the visualization 600 of FIG. 6. In the example of FIG. 7, the neural network has incorrectly classified the input image 720 as being of a 1 or possibly a 7, instead of being of an 8. This incorrect classification may have been due to the character having been drawn smaller and/or off center. Incorrect classification may also occur if the character is drawn sideways or (in the case of characters other than 1, 6, 8, and 9) upside-down.

As can be seen from the above description of neural network pipeline processing, large amounts of raw data will be accessed (e.g., fetched and stored) as needed for processing by intermediate modules (e.g., hidden layers). For example, input data (e.g., an image or a video frame) can be fetched to the neural network, and, after each layer is done processing, intermediate data and weighting factors are stored and fetched to the next layers in the neural network. Such data access requires high bandwidth usage, which leads to high processing requirements and high power consumption. In some cases, for the intermediate layers of a neural network, either 8 bit or 16 bit fixed or floating point operations are performed, which requires a large burden of memory access (for both internal memory and external memory).

High bandwidth requirement for data access may not only limit overall system processing capability, but can also significantly increase power consumption and therefore degrade overall product quality, especially for devices (e.g., mobile devices) that have limited power capabilities. On the other hand, data processing requirements on devices (e.g., mobile devices) continue to increase. For example, in terms of video processing requirements, both video spatial and temporal resolutions and bit-depth resolution continue to increase. Accordingly, corresponding data bandwidth requirements continue to significantly increase, leading to a major bottleneck in neural network chip implementations (e.g., neural processing unit (NPU)) on devices. As described above, neural network processing can be used to handle a wide variety of functions (e.g., classifications). For example, mobile devices, virtual reality devices, vehicles, among other devices can use neural network processing for various functions. In some cases, a neural network system can have an input layer that includes an image or video frames as input, and can use a convolutional network with multiple intermediate (or hidden) layers/nodes and one final layer to produce a desired output decision. In such a network, the intermediate layers, as well as the input layer(s), require extremely high bandwidth usage.

Systems and methods are described herein for providing bandwidth compression for neural network data. For example, a neural network device or a neural network hardware component of a device can include one or more neural network coding engines (also referred to as "neural network compression engines") that can perform the bandwidth compression. In one example, a neural network component can include a neural processing unit (NPU) that is used for implementing a neural network for performing one or more functions (e.g., classification, object detection, object tracking, big data analysis, and/or any other suitable function). The neural network implemented by the neural network device or neural network hardware component can include any suitable neural network, such as a convolutional neural network, an Linguistic Fuzzy Trust Model (LFTM) neural network, or any other suitable supervised or unsupervised neural network. As described in more detail below, the NPU can perform bandwidth compression for neural network data processed by the NPU. The compression techniques used herein can apply to any neural network data, in order to reduce the amount of data that needs to be stored in memory and retrieved by the neural network device or neural network component. In some examples, the neural network component (e.g., an NPU) can include one or more computer chips. For instance, the neural network component (e.g., the NPU) can be included in a device, such as a mobile device, a vehicle, or other electronic device. In one illustrative example, an NPU can be a chip that is included on a circuit board that can be installed in a mobile device, a vehicle, or other electronic device for performing neural network functions.

To reduce memory access bandwidth requirements for neural network data, the neural network device or neural network component can perform a method to compress data from intermediate nodes in the neural network in a lossless manner. For example, a neural network coding engine of the neural network device or neural network component can be used after each hidden layer of a neural network to compress the activation data output from each hidden layer. The activation data output from a hidden layer can include a 3D volume of data having a width, height, and depth, with the depth corresponding to multiple layers of filters for that hidden layer, and each depth layer having a width and height. For instance, a feature map (with activation or feature data) having a width and height is provided for each depth layer. The compressed data can be stored in a storage device or memory. The storage device or memory can be internal to the neural network device or neural network hardware component, or can be external to the device or hardware component. The neural network coding engine can retrieve the compressed activation data (e.g., read the compressed data and load the data in a local cache), and can decompress the compressed activation data before providing the decompressed activation data as input to a next layer of the neural network. In some examples, a prediction scheme can be applied to the activation data, and residual data can be determined based on the prediction scheme. In one illustrative example, given a block of neural network data (e.g., activation data from a hidden layer), the neural network coding engine can apply a prediction scheme to each sample in the block of neural network data, and residual data can be determined based on the prediction scheme. The residual data can then be coded using a coding technique. Any suitable coding technique can be used, such as variable-length coding (VLC), arithmetic coding, other type of entropy coding, or other suitable technique.

Figure 8A:
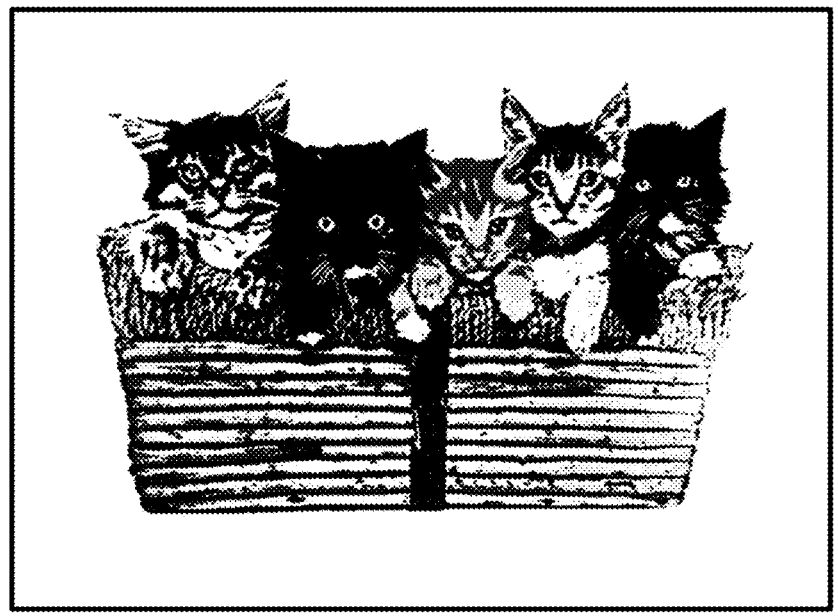
FIG. 8A is an illustration of an input image for a convolutional neural network.
Figure 8B:
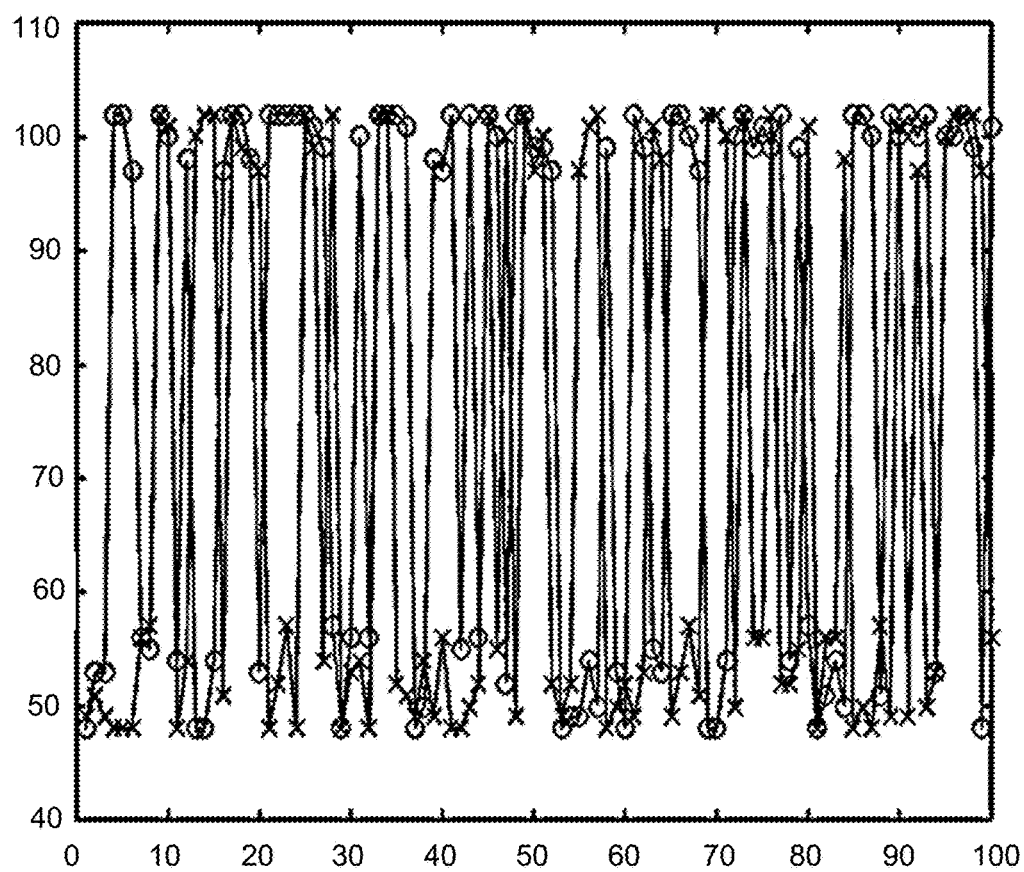
FIG. 8B is a graph illustrating distribution of intermediate layer neural network data of the convolutional neural network based on the input image illustrated in FIG. 8A.

The characteristic of neural network data is different from other multimedia data (e.g., video or image data). FIG. 8A is an illustration of an input image 800 of a group of cats that is used as input to a convolutional neural network. FIG. 8B is a graph 801 illustrating distribution of intermediate neural network data of the convolutional neural network based on the input image illustrated in FIG. 8A. The intermediate neural network data includes two sets of activation data output from one or more hidden layers of the convolutional neural network. In one illustrative example, the graph 801 can include two sets of activation data from a hidden layer, with one set of activation data corresponding to a first feature map from the hidden layer and the second set of activation data corresponding to a second feature map from the hidden layer. The x-axis of the graph 801 includes each activation data point (also referred to as a feature point) and the y-axis includes the values of each activation data point. One set of activation data is shown with circles at each activation data point value, and the other set of activation data is shown with x's at each activation data point value.

In general, multimedia data has a high correlation between neighboring data samples (e.g., neighboring pixels), so that some form of spatial or temporal-based prediction (e.g., Differential Pulse Code Modulation (DPCM) prediction or other suitable prediction) can be performed.

Figure 9:
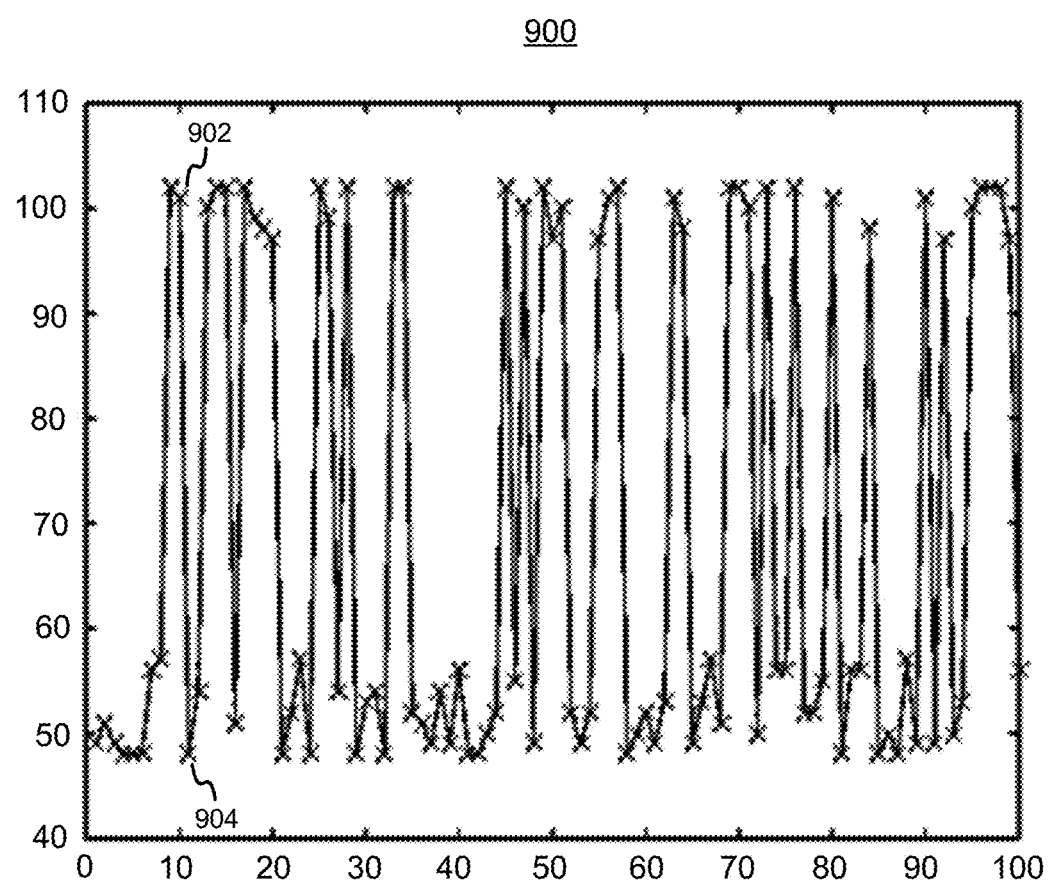
FIG. 9 is a graph illustrating distribution of neural network data.

However, with neural network data, there is no specific correlation between neighboring data samples (e.g., between activation data samples in a feature map). For example, referring again to FIG. 8A and FIG. 8B, while the input image 800 has a high correlation between spatial neighboring pixels, the intermediate layer data is much less correlated and has a very high dynamic range between activation data point values, as shown by the graph 801. FIG. 9 is another graph 900 illustrating a distribution of neural network data from a single set of activation data (e.g., a single feature map). As shown in FIG. 8B and FIG. 9, there is a high fluctuation, and thus a small correlation, between neighboring activation data samples. The neighboring samples are shown in the graphs 801 and 900 from left to right. For example, the left-most x in the graph 900 can include the top-left sample from a feature map (e.g., at position (0, 0), the next x can include the next sample in the feature map (e.g., at position (0, 1)), and so on. As shown, the values of the activation data samples tend to gather around two extreme points (e.g., around a value of 105 and 50 in the graphs 801 and 900), with neighboring samples tending to alternate from one extreme point to the next extreme point. For example, the activation data sample 902 has a value of approximately 105, while the next neighboring data sample 904 has a value of approximately 50.

Figure 10:
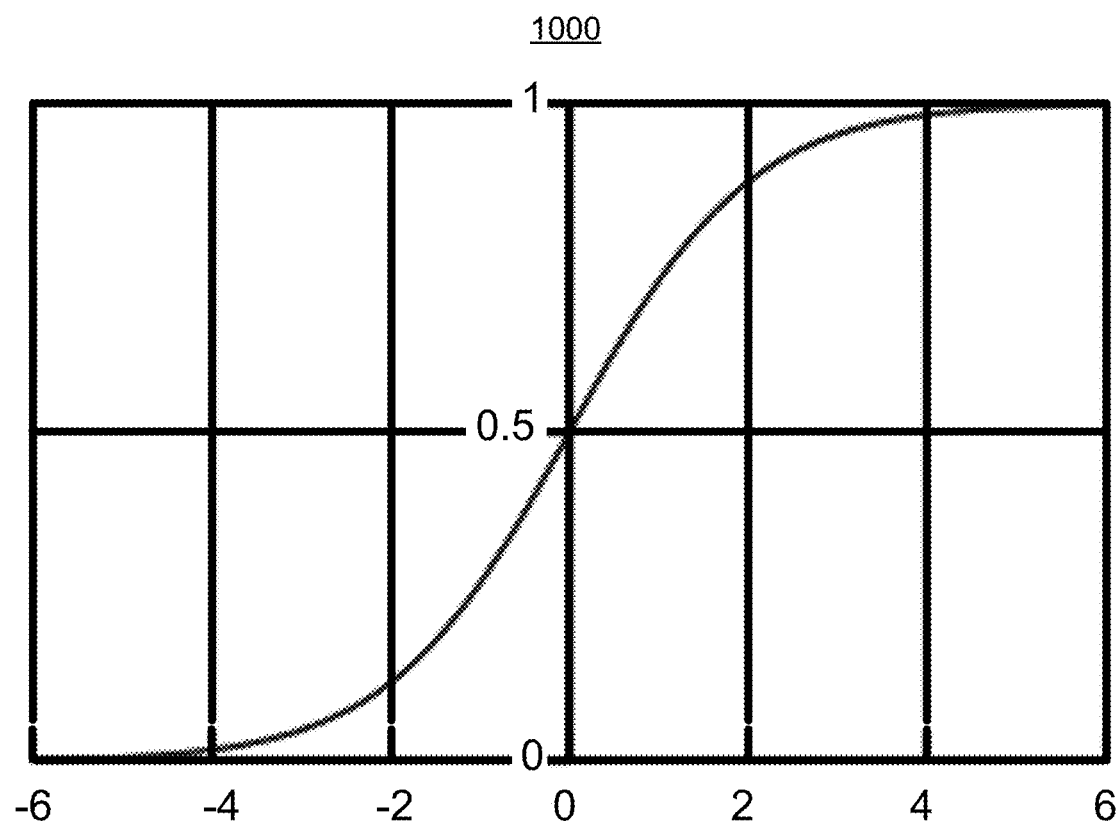
FIG. 10 is a graph illustrating a sigmoid function used in neural network output filtering.

The cause of such lack of correlation between activation data samples can be based on output filtering operations performed for each intermediate node. For instance, as described above, filtering operations can include a non-linear function being applied to the output data from each intermediate node. One illustrative example of a non-linear function that can be used for filtering activation data can include a sigmoid function. FIG. 10 is a graph 1000 illustrating a sigmoid function that can be used for neural network output filtering. Other non-linear functions include ReLu, a leaky ReLu, a tangent function (e.g., hyperbolic tangent Tan h), or any other suitable activation function. Due to the lack of correlation between activation data samples, it can be difficult to compress this kind of data. For example, if a simple neighbor based prediction that uses one or more neighboring samples to predict a current sample (e.g., DPCM or other similar type of spatial prediction) that uses neighboring data as a predictor) was applied to such activation data, the dynamic range of the residual would increase to a point that compression would not be feasible. For example, if residual data were generated by applying a neighbor based prediction on the activation data shown in the graph 900, the dynamic range of the residual would be high (as shown in the graph 11000 of FIG. 11, which is described below) due to the large difference in values between neighboring samples that can be seen in the graph 900.

Figure 11:
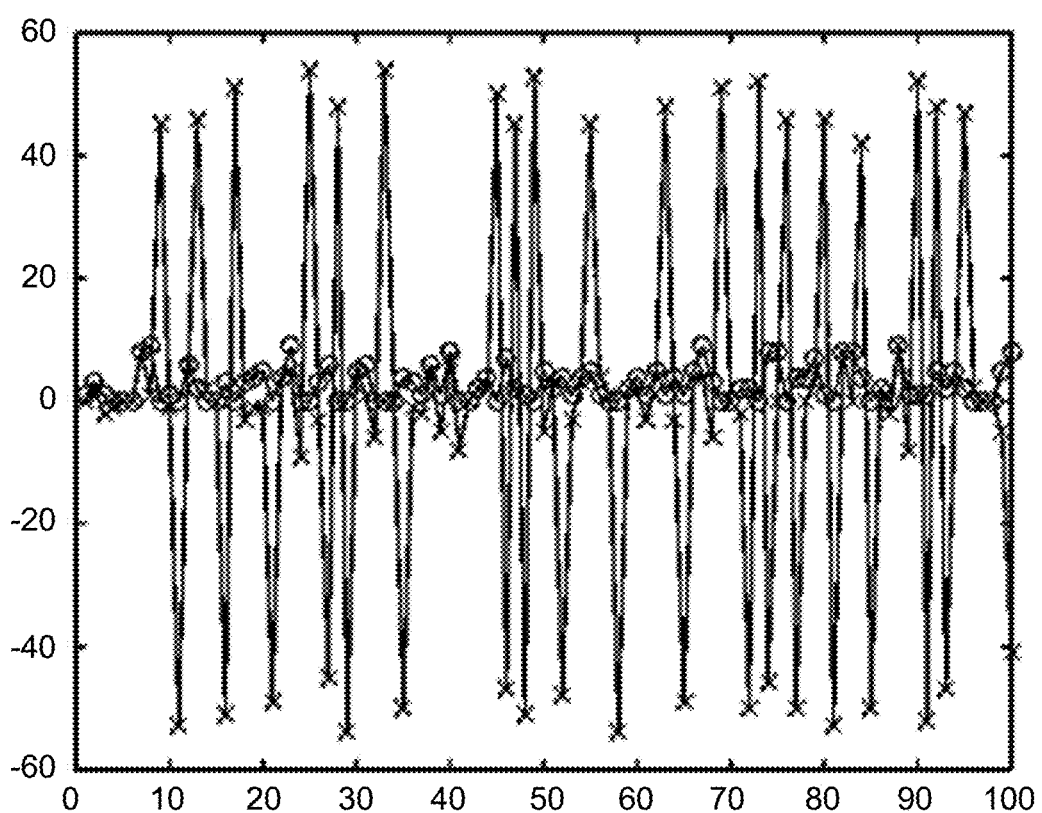
FIG. 11 is a graph illustrating a distribution of residual neural network data after prediction is performed.

The systems and methods described herein apply other prediction methods (e.g., a min/max based prediction) to the intermediate activation data in order to produce residual data with a reduced dynamic range. For example, a neural network coding engine can use a minimum and maximum of the activation data set to determine a predictor and a residual for each sample in the intermediate activation data, allowing high quality compression performance. Using such a prediction technique allows the dynamic range of the residual data to be reduced by a large amount. FIG. 11 is a graph 1100 illustrating a comparison between the distribution of residual neural network data after prediction is performed using the systems and methods described herein (with each residual data item being shown with a circle) and the distribution of residual neural network data after a neighbor based prediction is performed (with each residual data item being shown with an x). As shown, the dynamic range of the residual data is reduced to be between a value of 0 and a value of 15.

Figure 12A:
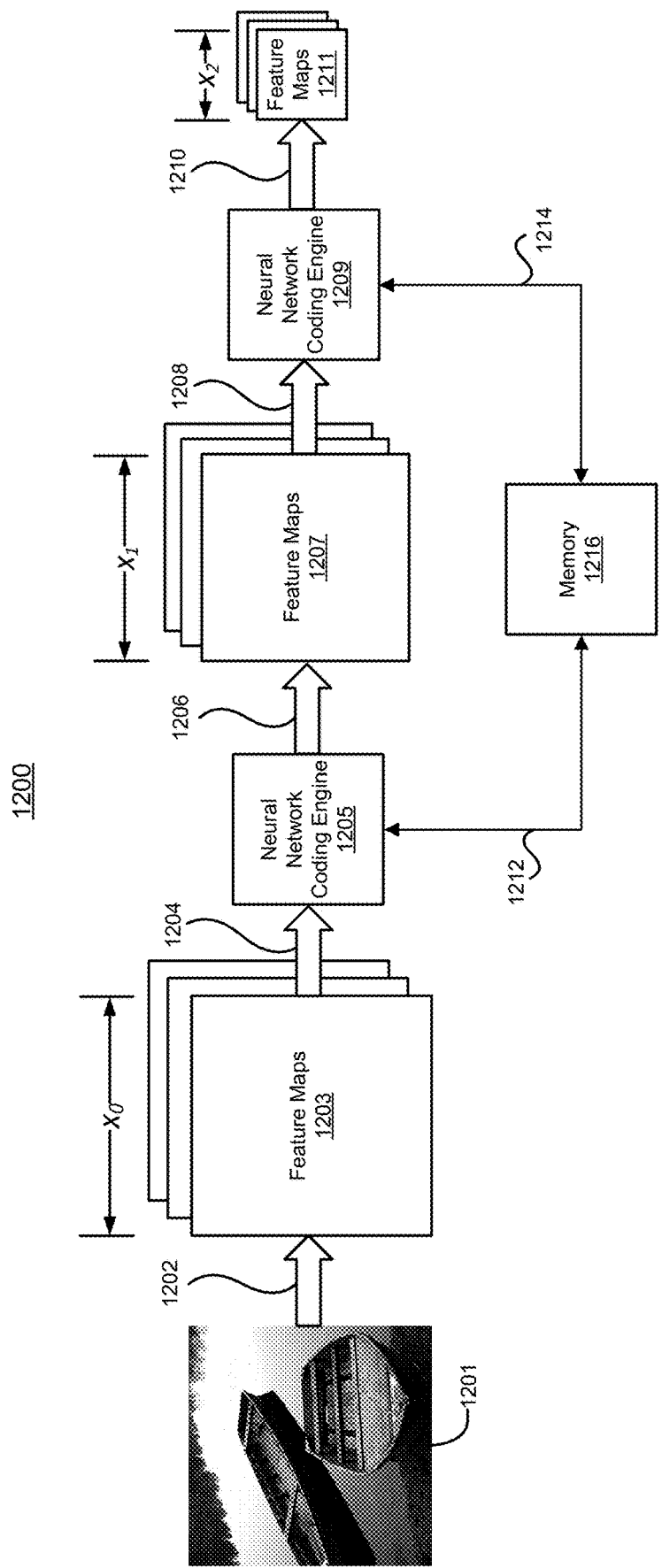
FIG. 12A is a diagram illustrating an example of a neural network including neural network coding engines.

FIG. 12A is a diagram illustrating an example architecture of a neural network 1200 that includes neural network coding engines (e.g., a neural network coding engine 1205 and a neural network coding engine 1209) for compressing neural network data. The neural network 1200 can be a convolutional neural network, or any other suitable neural network. The neural network 1200 can be implemented on a neural network component of a device, such as a computer chip. In one illustrative example, the neural network 1200 can be implemented by a neural processing unit (NPU). As shown, an input image 1201 is processed through a series of convolutional layers to generate feature maps 1203, feature maps 1207, and feature maps 1211. While only three convolutional layers are included in the neural network 1200, one of ordinary skill will appreciate that any other number of convolutional layers can be used. The convolutional layers perform convolutional operations, as described above. In some cases, non-linear activation functions (e.g., a sigmoid function, a tangent function, a ReLu function, and/or other activation function) can also be performed at one or more of the convolutional layers. In some cases, pooling operations can also be performed at one or more of the convolutional layers.

The input image 1201 has three channels (e.g., the image is in color, and has three color components per pixel), in which case three filters per convolutional layer are applied, resulting in each feature map having a depth of three. However, one of ordinary skill will appreciate that the concepts discussed herein can also be applied to input images that have a single channel (e.g., a black and white image) or to other inputs that have more than three channels, and thus can be applied to a single feature map produced by each convolutional layer or more than three feature maps produced by each convolutional layer. Accordingly, while three feature maps are shown for each layer (e.g., feature maps 1203 with a depth of three), one of ordinary skill will appreciate that the feature maps can be of any suitable depth. In some cases, a neural network coding engine (not shown) can be included after the input image 1201 in order to compress the image data for storage.

The first set of feature maps 1203 are produced by the neural network 1200 using input data 1202 from the input image 1201. The input data 1202 can include the pixels from the input image 1201 (e.g., R, G, and B values of the pixels, or the like). The first set of feature maps 1203 are $x_0$ samples wide and $x_0$ samples high. In some cases, the feature maps can have a different width and height. The activation data 1204 of first set of feature maps 1203 is provided to a neural network coding engine 1205, which compresses the activation data 1204 to generate compressed activation data 1212. The compressed activation data 1212 is stored in memory 1216, which can be located externally from the neural network component (e.g., an NPU) of the device implementing the neural network 1200 or can be located on the neural network component along with the neural network coding engine 1205.

When the activation data from the first set of feature maps 1203 is needed for processing by a next convolutional layer of the network 1200 to produce the second set of feature maps 1207, the neural network coding engine 1205 can retrieve the compressed activation data 1212. For example, the neural network coding engine 1205 can read the compressed activation data 1212 from the memory 1216 into a local cache of the neural network component (e.g., the NPU) of the device. The neural network coding engine 1205 can decompress the compressed activation data 1212 to generate activation data 1206. The activation data 1206 can be the same as the activation data 1204, or can include slight differences due to possible coding losses during the compression and decompression of the activation data 1204.

The activation data 1206 can then be provided to the next convolutional layer of the network 1200, which can generate the second set of feature maps 1207. The second set of feature maps 1207 are $x_1$ samples wide and $x_1$ samples high (with $x_1 < x_0$). In some cases, the feature maps can have a different width and height. The activation data 1208 of second set of feature maps 1208 is provided to a neural network coding engine 1209. In some cases, the neural network coding engine 1209 and the neural network coding engine 1205 are the same neural network coding engines. In other cases, the neural network coding engine 1209 and the neural network coding engine 1205 are different neural network coding engines that are implemented using separate hardware or software components (e.g., of the neural network component, such as an NPU). In either case, the neural network coding engine 1209 and the neural network coding engine 1205 perform the same or similar neural network coding operations. For example, the neural network coding engine 1209 compresses the activation data 1208 to generate compressed activation data 1214. The compressed activation data 1214 is stored in the memory 1216.

When the activation data from the second set of feature maps 1207 is needed for processing by a next convolutional layer of the network 1200 to produce the third set of feature maps 1211, the neural network coding engine 1209 can retrieve the compressed activation data 1214. For example, the neural network coding engine 1209 can read the compressed activation data 1214 from the memory 1216 into the local cache of the neural network component (e.g., the NPU) of the device. The neural network coding engine 1209 can decompress the compressed activation data 1214 to generate activation data 1210. The activation data 1210 can be the same as the activation data 1208, or can include slight differences due to possible coding losses during the compression and decompression of the activation data 1208. Details of the neural network coding engine 1205 and the neural network coding engine 1207 are described in more detail below with respect to FIG. 12B.

The activation data 1210 can then be provided to the next convolutional layer of the network 1200, which can generate the third set of feature maps 1211. The third set of feature maps 1211 are $x_2$ samples wide and $x_2$ (with $x_2 < x_1$) samples high. In some cases, the feature maps can have a different width and height. The activation data of the third set of feature maps 1211 can be used to generate an output (not shown), such as using one or more fully connected layers (not shown), or other suitable neural network architecture component. The output can include a classification result (e.g., probabilities that an object includes a certain class, or the like), an object detection result (e.g., a location and/or a class of an object, a location and/or identification of an object of interest from a group of objects, or the like), an object tracking result, a solution to an analytics problem (e.g., a statistical evaluation of a set of data), or any other output for a particular application for which the neural network 1200 is designed to operate. In some cases, a neural network coding engine (not shown) can be included after the third set of feature maps 1211 in order to compress the activation data of the third set of feature maps 1211. The compressed activation data can be decompressed before being used (e.g., by one or more fully connected layers) to generate the output.

Figure 12B:
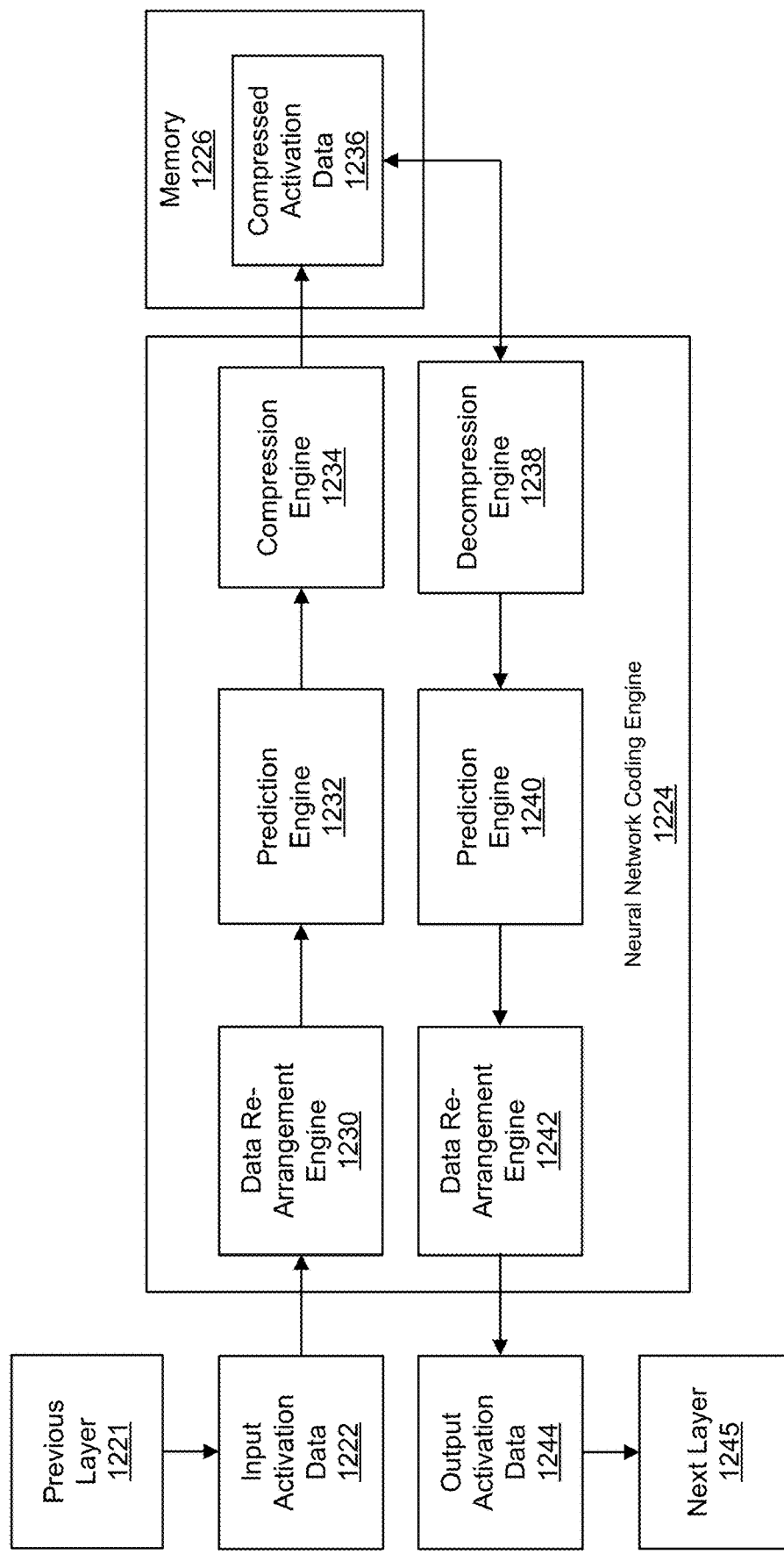
FIG. 12B is a diagram illustrating an example of a neural network coding engine.

FIG. 12B is a diagram illustrating an example of a neural network coding engine 1224. The neural network coding engine 1224 can be the neural network coding engine 1205 and/or the neural network coding engine 1209 shown in FIG. 12A. As shown, input activation data 1222 can be provided to the neural network coding engine 1224. The input activation data 1222 can be from a previous layer 1221 of a neural network (e.g., neural network 1200). For example, the input activation data 1222 can be part of one or more feature maps generated by the previous layer 1221 (e.g., the first set of feature maps 1203 shown in FIG. 12A).

As described above, the neural network coding engine 1224 compresses the input activation data 1222 to generate compressed activation data 1236. The compressed activation data 1236 is stored in memory 1226, which can be located externally from the neural network component (e.g., an NPU) of the device implementing the neural network 1200 or can be located on the neural network component (e.g., on the NPU chip) along with the neural network coding engine 1224. The neural network coding engine 1224 includes a data re-arrangement engine 1230, a prediction engine 1232, and a compression engine 1234, which can together be used for compressing the input activation data 1222 to generate the compressed activation data 1236.

In the neural network component (e.g., on an NPU chip), the basic memory layout can be in three-dimensional (3D) tiles. For example, a set of activation data (e.g., input activation data 1222) from an intermediate node (e.g., a hidden convolutional layer) can be divided into multiple 3D tiles by the data re-arrangement engine 1230. The 3D tile can be the basic processing unit processed by the neural network coding engine 1224, and the 3D tiles of a set of activation data are processed on a tile-by-tile basis. Each 3D tile can have a size of X×Y×Z, where X×Y is a spatial dimension (e.g., a width and height) of each 3D tile and Z is number of layers of each 3D tile. Each layer Z has an X×Y array of activation data samples. FIG. 13A is a diagram illustrating a spatial view of a 3D tile 1302 of neural network data. In one illustrative example, the 3D tile 1302 has dimensions (X, Y, Z)=(2, 2, 64), which is a total of 256 Bytes, assuming 8 bits per pixel (bpp). The 3D tile 1302 is shown with four sub-tiles, labeled as sub-tile 0, sub-tile 1, sub-tile 2, and sub-tile 3. With the example dimensions of (2, 2, 64), each sub-tile includes one pixel in each of the 64 dimensions.

Each 3D tile of data from an intermediate node can be stored in a linear layout 1304 (as shown in FIG. 13B) in the memory 1226. For example, the 3D tile 1302 can be arranged in 256 B of the memory 1226 as follows: bytes 0:63 in tile (0, 0, 0:63); bytes 64:127 in tile (1, 0, 0:63); bytes 128:191 in tile (2, 0, 0:63); and bytes 192:255 in tile (3, 0, 0:63).

The neural network coding engine 1224 may be designed to process a 1D or 2D block of data (instead of a 3D set of data) by rearranging the 3D data into 1D or 2D data, which results in simpler and more efficient processing. To process data with such a memory layout using the neural network coding engine 1224 of the neural network hardware component (e.g., an NPU), the data re-arrangement engine 1230 can re-arrange each 3D tile into a 1D block or a 2D set of sub-blocks using a re-arrange scanning pattern. The re-arrange scanning pattern focuses on maximizing spatial correlation and maximizing consecutive numbers of zeros. An optimal re-arrange scanning pattern can be determined either adaptively for each block or in a fixed pattern. In some cases, the data of the 3D tile can be arranged into a 1D block of values (256 values), and the 1D block of values can be processed by the prediction engine 1232. In such cases, a processing unit for the prediction engine 1232 can include a 1D block of data. In some cases, the 1D block of values can be divided into any number of rows (referred to as sub-blocks), resulting in a 2D arrangement of the data. For example, the 1D block of values can be divided into four sub-blocks (or rows), as described in the below illustrative example (with each sub-block or row having 64 of the 256 values). Other divisions can also be used, such as two sub-blocks with 128 values in each block, eight sub-blocks with 32 values in each block, or other suitable arrangement. Dividing the 1D block of values into sub-blocks (or rows) can be performed so that each sub-block can be processed independently and in parallel, instead of attempting to process the entire 1D block of values at the same time. Such a mechanism can reduce processing time by a factor equal to the number of sub-blocks (e.g., by a factor of four in the example provided above using four sub-blocks). In such cases, a processing unit for the prediction engine 1232 can include a 1D sub-block of data.

In one illustrative example, the 2×2×64 data[X][Y][Z] arrangement (shown in FIG. 13A) can be converted to a 64×4 new_data[XX][YY] re-arranged scanning pattern having four sub-blocks (or rows of data), with each sub-block having 64 values. After rearranging, [YY] is the sub-block index, and [XX] is the index within each sub-block. The 2×2×64 data[X][Y][Z] can be converted to 64×4 new_data [XX][YY] using the following patterns:

Sub-block 0 with index [XX][0]:
New_data[0][0]=data[0][0][0];
New_data[1][0]=data[0][1][0];
New_data[2][0]=data[1][0][0];
New_data[3][0]=data[1][1][0];
New_data[4][0]=data[0][0][1];
New_data[5][0]=data[0][1][1];
New_data[6][0]=data[1][0][1];
New_data[7][0]=data[1][1][1];
New_data[60][0]=data[0][0][15];
New_data[61][0]=data[0][1][15];
New_data[62][0]=data[1][0][15];
New_data[63][0]=data[1][1][15];
Sub-block 1 with index [XX][1]:
New_data[0][1]=data[0][0][16];
New_data[1][1]=data[0][1][16];
New_data[2][1]=data[1][0][16];
New_data[3][1]=data[1][1][16];
New_data[4][1]=data[0][0][17];
New_data[5][1]=data[0][1][17];
New_data[6][1]=data[1][0][17];
New_data[7][1]=data[1][1][17]
New_data[60][1]=data[0][0][31]
New_data[61][1]=data[0][1][31]
New_data[62][1]=data[1][0][31]
New_data[63][1]=data[1][1][31]
Sub-block 2 with index [XX][2]:
New_data[0][2]=data[0][0][32];
New_data[1][2]=data[0][1][32];
New_data[2][2]=data[1][0][32];
New_data[3][2]=data[1][1][32];
New_data[4][2]=data[0][0][33];
New_data[5][2]=data[0][1][33];
New_data[6][2]=data[1][0][33];
New_data[7][2]=data[1][1][33]
New_data[60][2]=data[0][0][47]
New_data[61][2]=data[0][1][47]
New_data[62][2]=data[1][0][47]
New_data[63][2]=data[1][1][47]
Sub-block 3 with index [XX][3]:
New_data[0][3]=data[0][0][48];
New_data[1][3]=data[0][1][48];
New_data[2][3]=data[1][0][48];
New_data[3][3]=data[1][1][48];
New_data[4][3]=data[0][0][49];
New_data[5][3]=data[0][1][49];
New_data[6][3]=data[1][0][49];
New_data[7][3]=data[1][1][49]
New_data[60][3]=data[0][0][63]
New_data[61][3]=data[0][1][63]
New_data[62][3]=data[1][0][63]
New_data[63][3]=data[1][1][63]

To explain the notation above, the first eight samples of sub-block 0 of the re-arranged data will be described, which are denoted above as: New_data[0][0]=data[0][0][0]; New_data[1][0]=data[0][1][0]; New_data[2][0]=data[1][0][0]; New_data[3][0]=data[1][1][0]; New_data[4][0]=data[0][0][1]; New_data[5][0]=data[0][1][1]; New_data[6][0]=data[1][0][1]; and New_data[7][0]=data[1][1][1].

The first sample of sub-block 0 of the re-arranged data (denoted as New_data[0][0]) is the sample from the top-left spatial position ((X, Y)=(0, 0)) of the first layer (Z=0). The top-left spatial position is labeled as sub-tile 0 in FIG. 13A. The second sample of sub-block 0 of the re-arranged data (denoted as New_data[1][0]) is the sample from the top-right spatial position ((X, Y)=(0, 1) and labeled as sub-tile 1 in FIG. 13A) of the first layer (Z=0). The third sample of sub-block 0 of the re-arranged data (denoted as New_data [2][0]) is the sample from the bottom-left spatial position ((X, Y)=(1,0) and labeled as sub-tile 2 in FIG. 13A) of the first layer (Z=0). The fourth sample of sub-block 0 of the re-arranged data (denoted as New_data[3][0]) is the sample from the bottom-right spatial position ((X, Y)=(1, 1) and labeled as sub-tile 3 in FIG. 13A) of the first layer (Z=0). The fifth sample of sub-block 0 of the re-arranged data (denoted as New_data[4][0]) is the sample from the top-left spatial position ((X, Y)=(0, 0) and labeled as sub-tile 1 in FIG. 13A) of the second layer (Z=1). The sixth sample of sub-block 0 of the re-arranged data (denoted as New_data [5][0]) is the sample from the top-right spatial position ((X, Y)=(0, 1) and labeled as sub-tile 1 in FIG. 13A) of the second layer (Z=1). The seventh sample of sub-block 0 of the re-arranged data (denoted as New_data[6][0]) is the sample from the bottom-left spatial position ((X, Y)=(1,0) and labeled as sub-tile 2 in FIG. 13A) of the second layer (Z=1). The eighth sample of sub-block 0 of the re-arranged data (denoted as New_data[7][0]) is the sample from the bottom-right spatial position ((X, Y)=(1, 1) and labeled as sub-tile 3 in FIG. 13A) of the second layer (Z=1).

A similar process is performed to re-arrange the remaining samples from the third layer (Z=2) through the sixteenth layer (Z=15) into the sub-block 0 of the re-arranged data, to re-arrange the samples from the seventeenth layer (Z=16) through the thirty-second layer (Z=31) into the sub-block 1 of the re-arranged data, to re-arrange the samples from the thirty-third layer (Z=32) through the forty-eighth layer (Z=47) into the sub-block 2 of the re-arranged data, and to re-arrange the samples from the forty-ninth layer (Z=48) through the last layer (Z=63) into the sub-block 3 of the re-arranged data.

Such an arrangement results in the data being re-arranged into four (4) sub-blocks, with each sub-block having 64 values. Each of the sub-blocks (which includes a row of data from the 256 bytes of the 3D data) has data from 16 of the 64 layers. Any other re-arrangement of the data can be used, as described above (e.g., eight sub-blocks with 32 bytes each, two sub-blocks with 128 bytes each, or other suitable arrangement). The selection of sub-block number, shape, and size is dependent on user implementation preferences, and/or application requirements.

After the data is re-arranged by the data re-arrangement engine 1230, a prediction method can be selected by the prediction engine 1232 for application to a processing unit, which can include the re-arranged 1D block or the individual sub-blocks of the 1D block. Examples of prediction methods that can be selected for use by the prediction engine 1232 include the following: (1) spatial prediction mode using neighboring data as a predictor; (2) minimum-maximum (min/max) prediction mode using min or max as a predictor; and (3) a non-prediction mode (or "no prediction"). Using the selected prediction method, a predictor and a residual value can be determined for each sample.

For the spatial prediction mode, there are several possibilities of deriving a predictor for a current sample using spatial neighboring samples of the current sample. One illustrative example is using the left (L), upper (U), and upper-left (UL) samples as a predictor. For instance, using such samples, the predictor for the current sample can be determined as predictor=L+U-UL. Another illustrative example is using either the left or upper or upper-left neighboring sample as a predictor for a current sample. Any other suitable technique can be used to determine a predictor for a current sample based on spatially neighboring samples. The residual for the current sample can then be derived as follows:

Residual=current sample data−predictor

In some examples, a sign to un-sign conversion can then be performed for the residual data to remove any negative numbers.

For the minimum-maximum prediction mode (min/max prediction), the prediction engine 1232 can first derive a minimum value (min) and a maximum value (max) of the activation data within the current processing unit (the 1D block of values or a sub-block after re-arrangement). The minimum value is the smallest value from the current processing unit, and maximum value is the largest value from the current processing unit. For each sample (e.g., for each new_data[XX][YY] sample) in the processing unit, the prediction engine 1232 can then apply either the min or the max as the predictor based on the following condition:

If data−min>max−data, then Predictor=max;

Else Predictor=min.

The prediction engine 1232 decides whether it will use the min or the max as the predictor using the equation above. Using the above equation, if the value of the current sample is closer to the min value, then the min is used as the predictor, whereas if the value of the current sample is closer to the max value, then the max is used as the predictor.

The prediction engine 1232 can then compute the residual as follows:

If predictor==max, Residual=max−data;

Else Residual=data−min.

By using the minimum-maximum based residual determination, the dynamic range of the original activation data is reduced by a large amount. For example, by subtracting the min from each sample or subtracting each sample from the max, the value of each residual value will be within a limited range, such as that shown in FIG. 11. For example, using 256 byte data as an example, the dynamic range of the original data is between 0-256 (requiring 8 bits), while the dynamic range of the residual data using the minimum-maximum prediction mode is reduced to between 0-10 (requiring 4 bits or less), as shown in FIG. 11. Another benefit of using a minimum/maximum to compute the residual is that it ensures that the residual is always non-negative, so that there is no need for signed data to unsigned data conversion.

For the third option (no prediction or "non-prediction"), the prediction engine 1232 does not apply any prediction method, in which case the residual is equal to current data.

As a signaling overhead, there needs to be N bits per each processing unit to signal which predictor type is being used (spatial prediction, min/max prediction, or no prediction). For example, in case minimum or maximum predictors are used, minimum or maximum data per each processing unit needs to be signaled, as well as a 1-bit signaling per each data sample to let a next neural network node (a next layer) know whether the predictor is the min or the max.

In some examples, the prediction engine 1232 can perform a switching between spatial based (e.g., DPCM or the like) prediction, minimum-maximum prediction, and, in some cases, no prediction. For instance, there are cases when DPCM based prediction may be the best prediction option, such as for data with higher spatial correlation, which can include data from input layers and/or some intermediate layers. The prediction engine 1232 can select the optimal prediction method for each individual sample, for each set of activation data being processed, or for any other group of samples. The optimal prediction method can be selected based on characteristics of the sample, based on characteristics of the activation data, or based on other input data (e.g., image data from an input image). For example, spatial based prediction can be used for layers producing data with higher spatial correlation (e.g., an input layer or early hidden layers), while minimum-maximum prediction can be used for intermediate layers with activation data that has low correlation (with large differences between neighboring data). In another example, if the spatial and/or minimum-maximum prediction are not performing well, then the non-prediction mode (no prediction) may be performed in the event the original data is a better residual value than the predictor based residuals generated using the spatial and minimum-maximum based predictions. In some cases, all three options can be performed, and then the best option can be selected based on the prediction method that provides the best residual value (e.g., the smallest residual value).

In some cases, after prediction is performed on a processing unit to generate a residual for each sample, a coding technique can be applied by the compression engine 1234 to code the residuals. In some cases, the residual data can be stored as the compressed activation data 1236, without further compressing the residuals data using the compression engine 1234. Examples of coding techniques that can be applied by the compression engine 1234 include entropy coding (e.g., run-length coding with variable length codes (VLC), arithmetic coding, Huffman coding, or other suitable entropy coding technique), interpolative coding, discrete cosine transform (DCT) coding, or other suitable coding technique that can be applied to represent the residuals using a coded representation. In some cases, the coding technique can be a lossless coding technique, such as the entropy coding techniques noted above.

In one illustrative example, VLC coding is used, in which case codeword tables may be either fixed or adaptive. In the event fixed codeword tables are used, predefined VLC tables can be used, such as Truncated-Unary (TU) code, Exponential-Golomb (EG) code, or other suitable predefined VLC tables. In the event adaptive codeword tables are used, VLC tables could be updated on the fly, for example based on number of MSBs to be compressed.

When the activation data of the one or more feature maps from previous layer 1221 is needed for processing by a next layer 1245 of the neural network to produce another set of one or more feature maps or to produce an output, the neural network coding engine 1224 can retrieve the compressed activation data 1236 from the memory 1226. For example, when one or more layers are finished processing input data, the resulting compressed activation data 1236 is stored into the memory 1226 (e.g., an external memory), and then when it is time for the next layer to process the decompressed activation data, the neural network coding engine 1224 reads the compressed activation data 1236 and decompresses it. The neural network coding engine 1224 can read the compressed activation data 1236 from the memory 1226 into a local cache of the neural network component (e.g., the NPU) of the device. The neural network coding engine 1224 can decompress the compressed activation data 1236 to generate output activation data 1244.

The compressed activation data 1236 is provided (e.g., from cache) to the decompression engine 1238. In the event the residual data was stored as the compressed activation data 1236 (without being compressed by the compression engine 1234), the compressed activation data 1236 can be provided to the prediction engine 1240. The decompression engine 1238 performs an inverse of the compression technique utilized by the compression engine 1234. For example, the decompression engine 1238 can perform inverse entropy coding (e.g., run-length coding with variable length codes (VLC), arithmetic coding, Huffman coding, or other suitable entropy coding technique), inverse interpolative coding, inverse discrete cosine transform (DCT) coding, or other suitable coding technique that can be applied to decode the coded representation of the residual data.

In one illustrative example, if VLC coding was used by the compression engine 1234, the decompression engine 1238 can access the fixed or adaptive codeword tables to determine the residual values from the coded representations. In the event fixed codeword tables are used, predefined VLC tables can be accessed, such as Truncated-Unary (TU) code, Exponential-Golomb (EG) code, or other suitable predefined VLC tables. In the event adaptive codeword tables are used, VLC tables that were updated on the fly (e.g., based on number of MSBs to be compressed) can be accessed.

The resulting residual data is then provided to the prediction engine 1240. The prediction engine can determine the type of prediction that was used and other relevant information that can be used to generate the decompressed activation data. For instance, in the event min/max predictors were used, the min and max data for a processing unit are provided along with information regarding whether the predictor is the min or the max for each sample. Using such information for a given residual sample, the prediction engine 1240 can use the min or max predictor to determine the decompressed activation data sample associated with the given residual sample. For instance, if the predictor is the max value, the decompressed activation data sample can be computed as:

$$\text{data} = \text{max} - \text{residual}$$

In another example, if the predictor is the min value, the decompressed activation data sample can be computed as:

$$\text{data} = \text{residual} + \text{min}$$

In the event the spatial prediction is used, the decompressed activation data sample can be computed using the predictor value (if signaled with the data) and the residual value as:

$$\text{data} = \text{residual} + \text{predictor}$$

If the predictor is not provided, the prediction engine 1240 can determine the predictor using the data of the spatially neighboring samples that were used to determine the predictor. For example, if the left (L), upper (U), and upper-left (UL) samples were used to determine the predictor, the predictor can be determined using a similar function as that used by the prediction engine 1232 (predictor=L+U−UL). Such a technique assumes that the left, upper, and upper-left decompressed sample values have been previously determined.

The decompressed activation data can then be provided to the data re-arrangement engine 1242 in order to re-arrange the 1D block or the multiple 1D sub-blocks of the 1D block into a 3D tile having a width (X), height (Y), and depth (Z), such as that shown in FIG. 13A. The inverse of that performed by the data re-arrangement engine 1230 can be performed by the data re-arrangement engine 1242 in order to re-arrange the decompressed activation data into the 3D volume. For example, using the first two layers of the 3D tile as an example, the re-arranged data can be determined as:

First Layer (Z=0):
data[0][0][0]=New_data[0][0];
data[0][1][0]=New_data[1][0];
data[1][0][0]=New_data[2][0];
data[1][1][0]=New_data[3][0].
Second Layer (Z=1):
data[0][0][1]=New_data[4][0];
data[0][1][1]=New_data[5][0];
data[1][0][1]=New_data[6][0];
data[1][1][1]=New_data[7][0].

A similar process is performed to re-arrange the remaining samples into the third layer (Z=2) through the sixteenth layer (Z=15) from the sub-block 0 of the re-arranged data, to re-arrange the samples into the seventeenth layer (Z=16) through the thirty-second layer (Z=31) from the sub-block 1 of the re-arranged data, to re-arrange the samples into the thirty-third layer (Z=32) through the forty-eighth layer (Z=47) from the sub-block 2 of the re-arranged data, and to re-arrange the samples into the forty-ninth layer (Z=48) through the last layer (Z=63) from the sub-block 3 of the re-arranged data.

The data re-arrangement engine 1242 can then provide the 3D tile of data as the output activation data 1244. The output activation data 1244 can be the same as the input activation data 1222, or can include slight differences due to possible coding losses during the compression and decompression of the activation data 1222. The output activation data 1244 can then be provided to a next layer 1245 of the neural network, which can include an intermediate layer or an output layer of the neural network.

Figure 14:
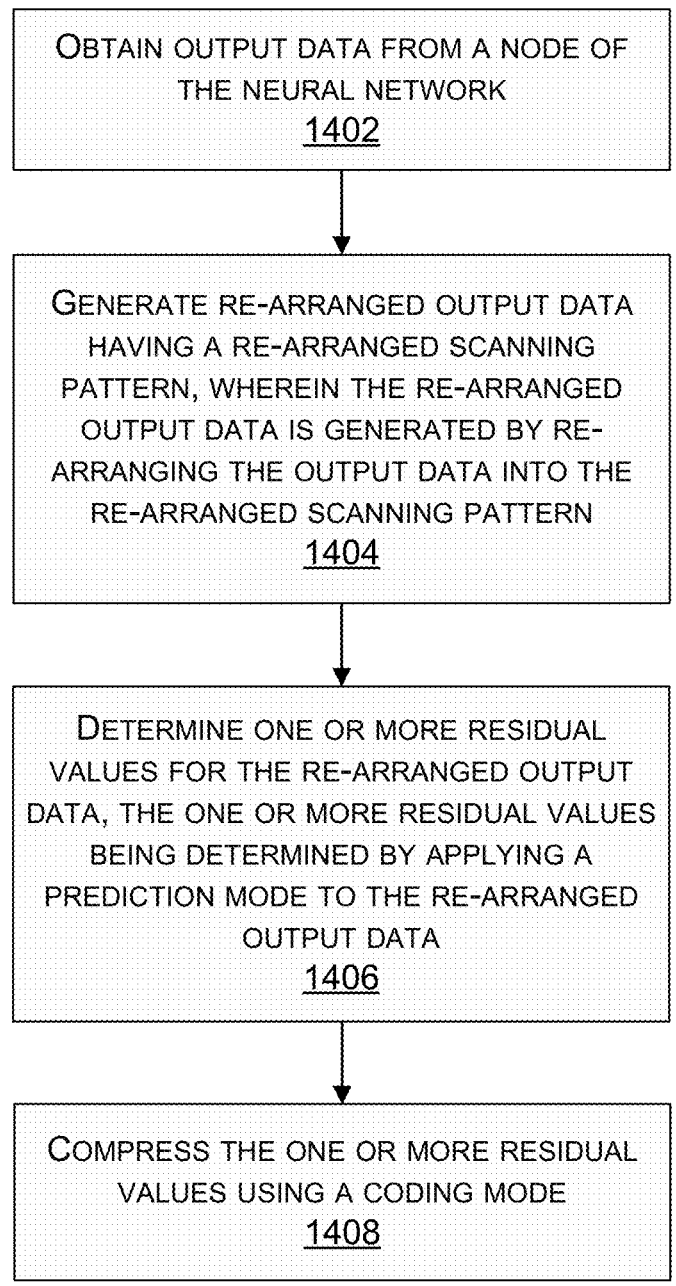
FIG. 14 is a flowchart illustrating an example of a process for performing classification task management, in accordance with some examples.

FIG. 14 is a flowchart illustrating an example of a process 1400 of compressing data in a neural network using the techniques described herein. At block 1402, the process 1400 includes obtaining output data from a node of the neural network. In some cases, the output data can be generated based on one or more images input into the neural network. In such cases, the output data can include pixels when the node of the neural network includes an input layer (e.g., where an input image is received). In some cases, the node of the neural network can be a hidden layer, in which case the output data can include activation data output from the hidden layer. The output data can include data generated based on any other data input to the neural network system, such as data from a database, audio data, a document, and/or any other suitable input data that can be processed using a neural network.

At block 1404, the process 1400 includes generating re-arranged output data having a re-arranged scanning pattern. The re-arranged output data is generated by re-arranging the output data into the re-arranged scanning pattern. In some cases, the output data is in three dimensions, and the re-arranged scanning pattern of the re-arranged output data is in one dimension or in two dimensions. For example, as described above with respect to FIG. 12, FIG. 13A, and FIG. 13B, the data of a 3D tile can be arranged into a 1D block of values (e.g., 128 values, 256 values, or other suitable 1D block of values). In some cases, a processing unit (e.g., for the prediction engine 1232) can include a 1D block of data. In some cases, the 1D block of values can be divided into any number of rows (referred to as sub-blocks), resulting in a 2D arrangement of the data. In one illustrative example, the 1D block of values can be divided into four sub-blocks (or rows), as described in the above-illustrative example that uses sub-blocks (or rows) each having 64 values out of 256 values in the 1D block of values. Other divisions can also be used, such as two sub-blocks with 128 values in each block, eight sub-blocks with 32 values in each block, or other suitable arrangement. In such cases, a processing unit (e.g., for the prediction engine 1232) can include a 1D sub-block of data, resulting in a total of four processing units (corresponding to four 1D sub-blocks of data) for each 1D block.

At block 1406, the process 1400 includes determining one or more residual values for the re-arranged output data. The one or more residual values are determined by applying a prediction mode to the re-arranged output data. In some examples, the prediction mode can include a minimum-maximum prediction mode, a spatial prediction mode, a non-prediction mode, or a combination thereof. No prediction is performed in the non-prediction mode. In some cases, the process 1400 can determine the one or more residual values for the re-arranged output data by determining one or more predictors based on the prediction mode applied to the re-arranged output data, and by determining the one or more residual values using the one or more predictors.

As noted above, the prediction mode can include a minimum-maximum prediction mode.

The process 1400 can apply the minimum-maximum prediction mode by determining a minimum value of the re-arranged output data, and determining a maximum value of the re-arranged output data. The minimum value or the maximum value can be selected as a predictor for each data sample in the re-arranged output data. In some implementations, the minimum value and the maximum value can be obtained while performing the re-arranging operation described above. For example, the minimum value and the maximum value of the re-arranged data can be determined while performing the re-arranging operation, and the minimum value or the maximum value of the re-arranged data can be used as the predictor.

In some cases, the minimum value can be selected as a predictor for a data sample in the re-arranged output data if a difference between a value of the data sample and the minimum value is greater than a difference between the maximum value and the value of the data sample. In some cases, the maximum value can be selected as a predictor for a data sample in the re-arranged output data if a difference between a value of the data sample and the minimum value is not greater than a difference between the maximum value and the value of the data sample. For instance, using the following equation as an illustrative example:

If data−min>max−data, then Predictor=max;

Else Predictor=min;

if the value of the current data sample of the re-arranged output data that is being processed is closer to the minimum (min) value, then the min value is used as the predictor. Otherwise, if the value of the current data sample is closer to the maximum (max) value, then the max value is used as the predictor. The process 1400 can then determine, using the minimum-maximum prediction mode, a residual value for each data sample using the predictor determined for each data sample and a residual value of each data sample. The prediction mode can also include, for certain samples, the spatial prediction mode and/or the non-prediction mode, which are described above.

In some cases, the process 1400 can include selecting the prediction mode from among the minimum-maximum prediction mode, the spatial prediction mode, and the non-prediction mode based on the output data from the node of the neural network. For example, the optimal prediction method can be selected for a sample of the re-arranged output data based on characteristics of the sample. In another example, the optimal prediction method can be selected for multiple samples (or all samples) of the re-arranged output data based on characteristics of the samples. In another example, the optimal prediction method can be selected based on other input data (e.g., image data from an input image). In one illustrative example, the spatial prediction mode can be used for layers producing data with higher spatial correlation (e.g., an input layer or early hidden layers), while minimum-maximum prediction can be used for intermediate layers with activation data that has low correlation (with large differences between neighboring data). In another example, if the spatial prediction mode and/or the minimum-maximum prediction mode are not performing well, then the non-prediction mode can be performed in the event the original data is a better residual value than the predictor based residuals generated using the spatial and minimum-maximum prediction modes. In some cases, all three options can be performed, and the best option can be selected based on the prediction method that provides the best residual value (e.g., the smallest residual value).

At block 1408, the process 1400 includes compressing the one or more residual values using a coding mode. Any suitable coding mode can be used. Examples of coding modes that can be applied (e.g., by the compression engine 1234) include entropy coding (e.g., run-length coding with variable length codes (VLC), arithmetic coding, Huffman coding, or other suitable entropy coding technique), interpolative coding, discrete cosine transform (DCT) coding, and/or other suitable coding technique that can be applied to represent the residuals using a coded representation. In some cases, the coding technique can be a lossless coding technique, such as the entropy coding techniques noted above.

In one illustrative example, the coding mode includes run-length coding with variable length coding (VLC). For instance, when VLC coding is used, codeword tables may be either fixed or adaptive. In the event fixed codeword tables are used, predefined VLC tables can be used, such as Truncated-Unary (TU) code, Exponential-Golomb (EG)

code, or other suitable predefined VLC tables. In the event adaptive codeword tables are used, VLC tables could be updated on the fly, for example based on number of MSBs to be compressed.

In some examples, the process 1400 may be performed by a computing device or an apparatus, such as a mobile device, a vehicle, a camera device, a component thereof, or other suitable computing device or apparatus. For example, the process 1400 can be performed by a neural network (e.g., neural network 1200), such as by a neural network coding engine (e.g., the neural network coding engine 1224) of the neural network. In some cases, the computing device or apparatus may include a processor, microprocessor, microcomputer, or other component of a device that is configured to carry out the steps of process 1400. In some examples, the computing device or apparatus may include a camera configured to capture image data and/or video data (e.g., a video sequence) including video frames. For example, the computing device may include a camera device (e.g., an IP camera, a digital camera, or other type of camera device) that includes a processing unit designed to implement one or more network coding engines. As another example, the computing device may include a mobile device with a camera (e.g., a camera device such as a digital camera, an IP camera or the like, a mobile phone or tablet including a camera, or other type of device with a camera) and a processing unit designed to implement one or more network coding engines. In some cases, the computing device may include a display for displaying images. In some examples, a camera or other capture device that captures the video data is separate from the computing device, in which case the computing device receives the captured video data. The computing device may further include a network interface configured to communicate data. The network interface may be configured to communicate Internet Protocol (IP) based data or other suitable data.

Process 1400 is illustrated as a logical flow diagram, the operation of which represent a sequence of operations that can be implemented in hardware, computer instructions, or a combination thereof. In the context of computer instructions, the operations represent computer-executable instructions stored on one or more computer-readable storage media that, when executed by one or more processors, perform the recited operations. Generally, computer-executable instructions include routines, programs, objects, components, data structures, and the like that perform particular functions or implement particular data types. The order in which the operations are described is not intended to be construed as a limitation, and any number of the described operations can be combined in any order and/or in parallel to implement the processes.

Additionally, the process 1400 may be performed under the control of one or more computer systems configured with executable instructions and may be implemented as code (e.g., executable instructions, one or more computer programs, or one or more applications) executing collectively on one or more processors, by hardware, or combinations thereof. As noted above, the code may be stored on a computer-readable or machine-readable storage medium, for example, in the form of a computer program comprising a plurality of instructions executable by one or more processors. The computer-readable or machine-readable storage medium may be non-transitory.

As noted, the computer-readable medium may include transient media, such as a wireless broadcast or wired network transmission, or a non-transitory computer-readable medium (e.g., non-transitory storage media), such as a hard disk, flash drive, compact disc, digital video disc, Blu-ray disc, or other computer-readable media. The computer-readable medium may be understood to include one or more computer-readable media of various forms, in various examples.

One of ordinary skill will appreciate that the less than ("<") and greater than (">") symbols or terminology used herein can be replaced with less than or equal to ("≤") and greater than or equal to ("≥") symbols, respectively, without departing from the scope of this description.

In the foregoing description, aspects of the application are described with reference to specific embodiments thereof, but those skilled in the art will recognize that the application is not limited thereto. Thus, while illustrative embodiments of the application have been described in detail herein, it is to be understood that the inventive concepts may be otherwise variously embodied and employed, and that the appended claims are intended to be construed to include such variations, except as limited by the prior art. Various features and aspects of the above-described examples may be used individually or jointly. Further, embodiments can be utilized in any number of environments and applications beyond those described herein without departing from the broader spirit and scope of the specification. The specification and drawings are, accordingly, to be regarded as illustrative rather than restrictive. For the purposes of illustration, methods were described in a particular order. It should be appreciated that in alternate embodiments, the methods may be performed in a different order than that described.

Where components are described as being "configured to" perform certain operations, such configuration can be accomplished, for example, by designing electronic circuits or other hardware to perform the operation, by programming programmable electronic circuits (e.g., processors, microprocessors, or other suitable electronic circuits) to perform the operation, or any combination thereof.

The various illustrative logical blocks, modules, circuits, and algorithm steps described in connection with the embodiments disclosed herein may be implemented as electronic hardware, computer software, firmware, or combinations thereof. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present application.

The techniques described herein may also be implemented in electronic hardware, computer software, firmware, or any combination thereof. Such techniques may be implemented in any of a variety of devices such as general purposes computers, wireless communication device handsets, or integrated circuit devices having multiple uses including application in wireless communication device handsets and other devices. Any features described as modules or components may be implemented together in an integrated logic device or separately as discrete but interoperable logic devices. If implemented in software, the techniques may be realized at least in part by a computer-readable data storage medium comprising program code including instructions that, when executed, performs one or more of the methods described above. The computer-readable data storage medium may form part of a computer program product, which may include packaging materials. The computer-readable medium may comprise memory or data storage media, such as random access memory (RAM) such as synchronous dynamic random access memory (SDRAM), read-only memory (ROM), non-volatile random access memory (NVRAM), electrically erasable programmable read-only memory (EEPROM), FLASH memory, magnetic or optical data storage media, and the like. The techniques additionally, or alternatively, may be realized at least in part by a computer-readable communication medium that carries or communicates program code in the form of instructions or data structures and that can be accessed, read, and/or executed by a computer, such as propagated signals or waves.

The program code may be executed by a processor, which may include one or more processors, such as one or more digital signal processors (DSPs), general purpose microprocessors, an application specific integrated circuits (ASICs), field programmable logic arrays (FPGAs), or other equivalent integrated or discrete logic circuitry. Such a processor may be configured to perform any of the techniques described in this disclosure. A general purpose processor may be a microprocessor; but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration. Accordingly, the term "processor," as used herein may refer to any of the foregoing structure, any combination of the foregoing structure, or any other structure or apparatus suitable for implementation of the techniques described herein. In addition, in some aspects, the functionality described herein may be provided within dedicated software modules or hardware modules configured for encoding and decoding, or incorporated in a combined video encoder-decoder (CODEC).

What is claimed is:

1. A method of compressing data in a neural network, the method comprising:
    obtaining activation data from an intermediate node of the neural network, the neural network including at least one input node, at least one intermediate node, and at least one output node, the at least one intermediate node including the intermediate node;
    generating re-arranged activation data having a re-arranged scanning pattern, wherein the re-arranged activation data is generated by re-arranging the activation data from the intermediate node of the neural network into the re-arranged scanning pattern;
    determining one or more residual values for the re-arranged activation data, the one or more residual values being determined by applying a prediction mode to the re-arranged activation data;
    compressing the one or more residual values using a coding mode;
    storing the compressed one or more residual values;
    generating decompressed activation data using the stored one or more compressed residual values; and
    providing, as input to one or more additional intermediate nodes of the neural network, the decompressed activation data.

2. The method of claim 1, wherein determining the one or more residual values for the re-arranged activation data includes:
    determining one or more predictors based on the prediction mode applied to the re-arranged activation data; and
    determining the one or more residual values using the one or more predictors.

3. The method of claim 1, wherein the prediction mode includes one or more of a minimum-maximum prediction mode, a spatial prediction mode, and a non-prediction mode, wherein no prediction is performed in the non-prediction mode.

4. The method of claim 3, further comprising selecting the prediction mode from among the minimum-maximum prediction mode, the spatial prediction mode, and the non-prediction mode based on the activation data from the intermediate node of the neural network.

5. The method of claim 1, wherein the prediction mode includes a minimum-maximum prediction mode, and wherein applying the minimum-maximum prediction mode includes:
    determining a minimum value of the re-arranged activation data;
    determining a maximum value of the re-arranged activation data;
    selecting the minimum value or the maximum value as a predictor for each data sample in the re-arranged activation data; and
    determining a residual value for each data sample using a respective predictor of each data sample and a respective value of each data sample.

6. The method of claim 5, wherein the minimum value is selected as a predictor for a data sample in the re-arranged activation data if a difference between a value of the data sample and the minimum value is greater than a difference between the maximum value and the value of the data sample.

7. The method of claim 5, wherein the maximum value is selected as a predictor for a data sample in the re-arranged activation data if a difference between a value of the data sample and the minimum value is not greater than a difference between the maximum value and the value of the data sample.

8. The method of claim 1, wherein the activation data is in three dimensions, and wherein the re-arranged scanning pattern of the re-arranged activation data is in two dimensions.

9. The method of claim 1, wherein the coding mode includes run-length coding with variable length coding.

10. An apparatus for compressing data in a neural network, comprising:
    a memory configured to store the data; and
    a processor configured to:
        obtain activation data from an intermediate node of the neural network, the neural network including at least one input node, at least one intermediate node, and at least one output node, the at least one intermediate node including the intermediate node;
        generate re-arranged activation data having a re-arranged scanning pattern, wherein the re-arranged activation data is generated by re-arranging the activation data from the intermediate node of the neural network into the re-arranged scanning pattern;
        determine one or more residual values for the re-arranged activation data, the one or more residual values being determined by applying a prediction mode to the re-arranged activation data;
        compress the one or more residual values using a coding mode;

store the compressed one or more residual values;
generate decompressed activation data using the stored one or more compressed residual values; and
provide, as input to one or more additional intermediate nodes of the neural network, the decompressed activation data.

11. The apparatus of claim 10, wherein determining the one or more residual values for the re-arranged activation data includes:
determining one or more predictors based on the prediction mode applied to the re-arranged activation data; and
determining the one or more residual values using the one or more predictors.

12. The apparatus of claim 10, wherein the prediction mode includes one or more of a minimum-maximum prediction mode, a spatial prediction mode, and a non-prediction mode, wherein no prediction is performed in the non-prediction mode.

13. The apparatus of claim 12, wherein the processor is further configured to select the prediction mode from among the minimum-maximum prediction mode, the spatial prediction mode, and the non-prediction mode based on the activation data from the intermediate node of the neural network.

14. The apparatus of claim 10, wherein the prediction mode includes a minimum-maximum prediction mode, and wherein applying the minimum-maximum prediction mode includes:
determining a minimum value of the re-arranged activation data;
determining a maximum value of the re-arranged activation data;
selecting the minimum value or the maximum value as a predictor for each data sample in the re-arranged activation data; and
determining a residual value for each data sample using a respective predictor of each data sample and a respective value of each data sample.

15. The apparatus of claim 14, wherein the minimum value is selected as a predictor for a data sample in the re-arranged activation data if a difference between a value of the data sample and the minimum value is greater than a difference between the maximum value and the value of the data sample.

16. The apparatus of claim 14, wherein the maximum value is selected as a predictor for a data sample in the re-arranged activation data if a difference between a value of the data sample and the minimum value is not greater than a difference between the maximum value and the value of the data sample.

17. The apparatus of claim 10, wherein the activation data is in three dimensions, and wherein the re-arranged scanning pattern of the re-arranged activation data is in two dimensions.

18. The apparatus of claim 10, wherein the coding mode includes run-length coding with variable length coding.

19. The apparatus of claim 10, wherein the apparatus comprises a mobile device.

20. The apparatus of claim 19, further comprising a camera for capturing one or more images, wherein the activation data is generated based on the one or more images.

21. The apparatus of claim 20, further comprising a display for displaying the one or more images.

22. A non-transitory computer-readable medium having stored thereon instructions that, when executed by one or more processors, cause the one or more processors to:
obtain activation data from an intermediate node of a neural network, the neural network including at least one input node, at least one intermediate node, and at least one node, the at least one intermediate node including the intermediate node;
generate re-arranged activation data having a re-arranged scanning pattern, wherein the re-arranged activation data is generated by re-arranging the activation data from the intermediate node of the neural network into the re-arranged scanning pattern;
determine one or more residual values for the re-arranged activation data, the one or more residual values being determined by applying a prediction mode to the re-arranged activation data;
compress the one or more residual values using a coding mode;
store the compressed one or more residual values;
generate decompressed activation data using the stored one or more compressed residual values; and
provide, as input to one or more additional intermediate nodes of the neural network, the decompressed activation data.

23. The non-transitory computer-readable medium of claim 22, wherein determining the one or more residual values for the re-arranged activation data includes:
determining one or more predictors based on the prediction mode applied to the re-arranged activation data; and
determining the one or more residual values using the one or more predictors.

24. The non-transitory computer-readable medium of claim 22, wherein the prediction mode includes one or more of a minimum-maximum prediction mode, a spatial prediction mode, and a non-prediction mode, wherein no prediction is performed in the non-prediction mode.

25. The non-transitory computer-readable medium of claim 24, further comprising instructions that, when executed by the one or more processors, cause the one or more processor to select the prediction mode from among the minimum-maximum prediction mode, the spatial prediction mode, and the non-prediction mode based on the activation data from the intermediate node of the neural network.

26. The non-transitory computer-readable medium of claim 22, wherein the prediction mode includes a minimum-maximum prediction mode, and wherein applying the minimum-maximum prediction mode includes:
determining a minimum value of the re-arranged activation data;
determining a maximum value of the re-arranged activation data;
selecting the minimum value or the maximum value as a predictor for each data sample in the re-arranged activation data; and
determining a residual value for each data sample using a respective predictor of each data sample and a respective value of each data sample.

27. The non-transitory computer-readable medium of claim 26, wherein the minimum value is selected as a predictor for a data sample in the re-arranged activation data if a difference between a value of the data sample and the minimum value is greater than a difference between the maximum value and the value of the data sample, and wherein the maximum value is selected as a predictor for a data sample in the re-arranged activation data if a difference between a value of the data sample and the minimum value is not greater than a difference between the maximum value and the value of the data sample.

28. The non-transitory computer-readable medium of claim 22, wherein the activation data is in three dimensions, and wherein the re-arranged scanning pattern of the re-arranged activation data is in two dimensions.

29. The non-transitory computer-readable medium of claim 22, wherein the coding mode includes run-length coding with variable length coding.

* * * * *